(12) United States Patent
Kang et al.

(10) Patent No.: US 7,548,457 B2
(45) Date of Patent: Jun. 16, 2009

(54) MULTI-BIT NONVOLATILE MEMORY DEVICE AND RELATED PROGRAMMING METHOD

(75) Inventors: Sang-Gu Kang, Suwon-si (KR); Young-Ho Lim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 289 days.

(21) Appl. No.: 11/607,991

(22) Filed: Dec. 4, 2006

(65) Prior Publication Data

US 2007/0253249 A1   Nov. 1, 2007

(30) Foreign Application Priority Data

Apr. 26, 2006  (KR) .................. 10-2006-0037429

(51) Int. Cl.
   *G11C 11/34* (2006.01)
(52) U.S. Cl. ..................... 365/185.03; 365/185.11; 365/185.14; 365/185.18
(58) Field of Classification Search ............ 365/185.03, 365/185.11, 185.12, 185.17, 185.18, 185.24, 365/185.14
   See application file for complete search history.

(56) References Cited

U.S. PATENT DOCUMENTS 6,781,877 B2   8/2004   Cernea et al.
7,366,013 B2*  4/2008   Roohparvar ............ 365/185.03
7,450,421 B2* 11/2008   Mokhlesi et al. ........ 365/185.17
2005/0018484 A1  1/2005  Sakuma et al.
2007/0189073 A1*  8/2007  Aritome ................. 365/185.18

FOREIGN PATENT DOCUMENTS

| JP | 2005025898 A | 1/2005 |
| JP | 2005538485 A | 12/2005 |
| KR | 100165468 B1 | 9/1998 |
| KR | 1020020001407 A | 1/2002 |
| KR | 1020040013189 A | 2/2004 |
| KR | 1020050004142 A | 1/2005 |
| KR | 1020050007653 A | 1/2005 |
| KR | 1020050083680 A | 8/2005 |

\* cited by examiner

*Primary Examiner*—Tuan T Nguyen
*Assistant Examiner*—Toan Le
(74) *Attorney, Agent, or Firm*—Volentine & Whitt, PLLC

(57) ABSTRACT

In a method of programming a nonvolatile memory device including a plurality of n-valued nonvolatile memory cells arranged in a matrix, wherein n is a natural number greater than or equal to two (2), the method includes; programming i-valued data to three or more memory cells contiguously arranged along a first direction of the matrix before programming (i+1)-valued data to any of the three or more memory cells, wherein i is less than n, and wherein the three or more memory cells are programmed during three or more respectively distinct program periods, and after programming the i-valued data to the three or more memory cells, programming (i+1)-valued data to a particular memory cell among the three or more memory cells.

34 Claims, 31 Drawing Sheets

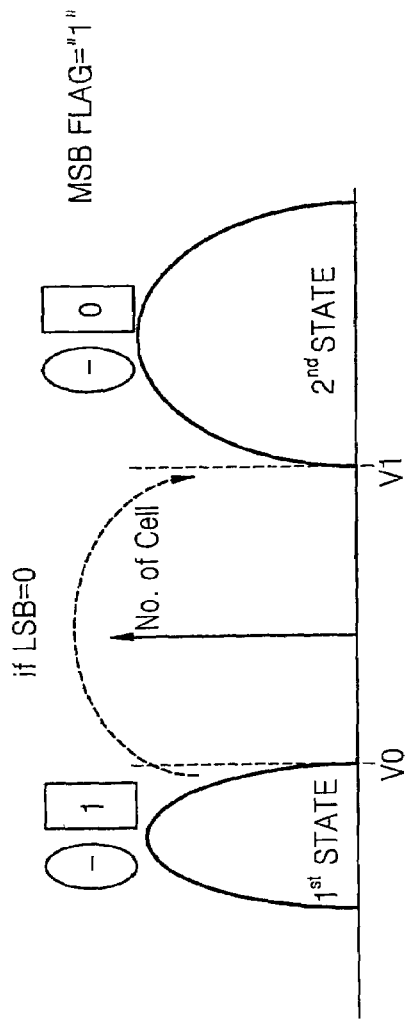
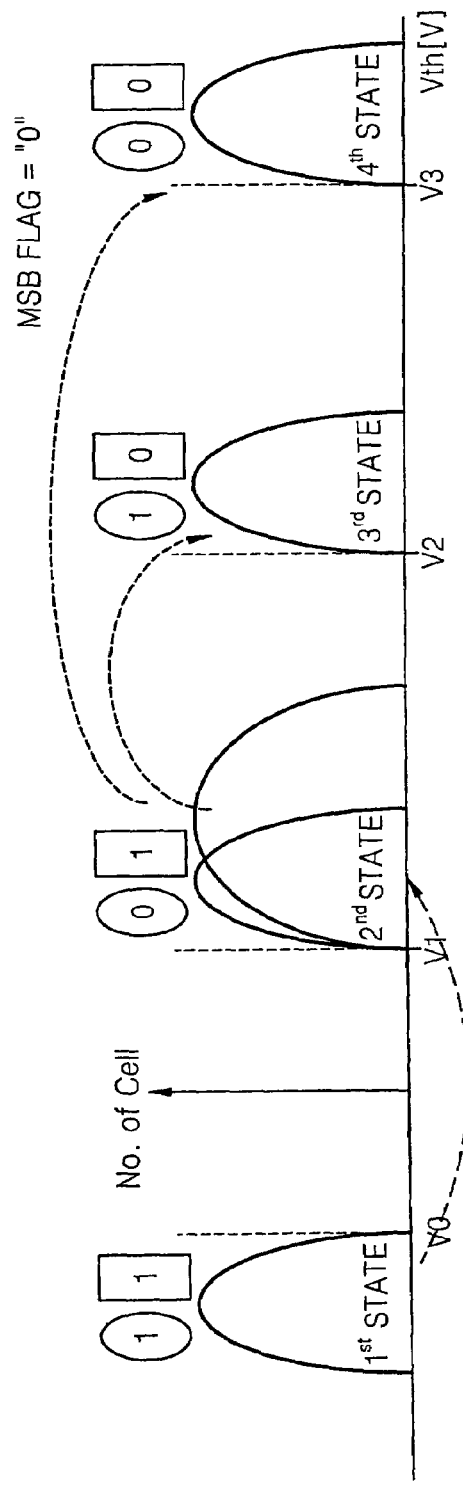
FIG. 17A
FIG. 17B

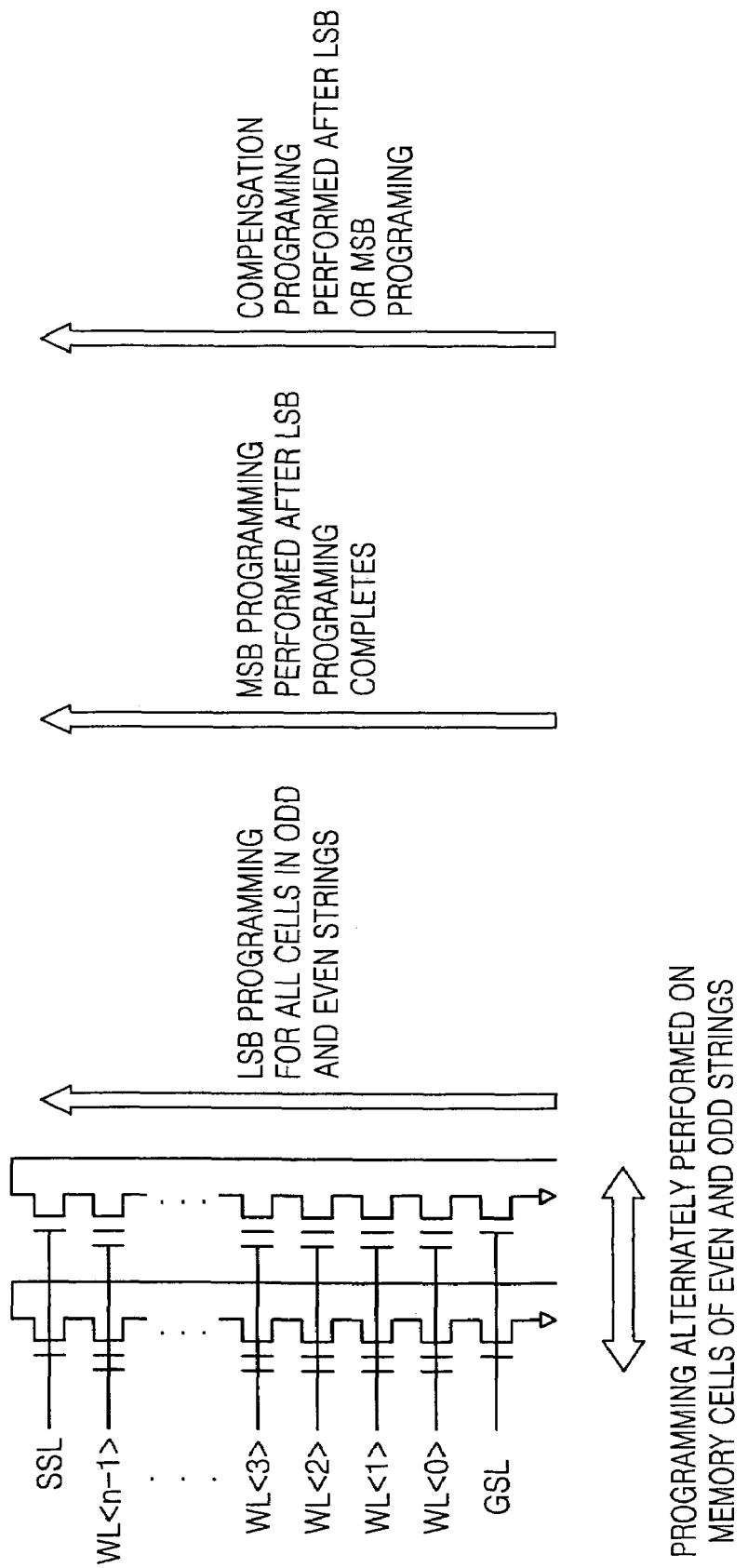

MULTI-BIT NONVOLATILE MEMORY DEVICE AND RELATED PROGRAMMING METHOD

BACKGROUND OF THE INVENTION

1. Field of the Invention

Embodiments of the invention relate generally to nonvolatile memory devices and related programming methods. More particularly, embodiments of the invention relate to programming methods adapted to reduce the negative effects of floating gate coupling in multi-bit nonvolatile semiconductor memory cells.

A claim of priority is made to Korean Patent Application No. 10-2006-0037429 filed Apr. 26, 2006, the disclosure of which is hereby incorporated by reference in its entirety.

2. Description of Related Art

The demand for electrically programmable and electrically erasable nonvolatile memory devices has increased dramatically in recent years. Such devices are at least partially characterized by the ability to maintain stored data even in the absence of supplied power. The use of so-called "flash memory" has become especially popular, particularly, but not exclusively, in the context of portable devices such as digital cameras, cell phones, personal digital assistants (PDAs), and laptop computers. Flash memory, such as NAND-type flash memory, is capable of storing large amounts of data in a relatively small area.

As background discussion, the basic operating principles underlying flash memory cells and flash memory devices will be presented below. However, it should be clearly understood that the discussion that follows is merely exemplary and does not in any way limit and/or define the scope of the present invention.

The operating principle of a flash memory cell will be described first with reference to FIGS. 1A through 1C. FIG. 1A illustrates a typical configuration in which a flash memory cell transistor is connected to word and bit lines of a memory device, FIG. 1B shows the circuit symbol of a flash memory cell transistor, and FIG. 1C shows the threshold voltage characteristics of a flash memory cell transistor.

Referring collectively to FIGS. 1A through 1C, a flash memory cell transistor includes a source region 4 and a drain region 5 located at the surface of a substrate 3. In this example, the substrate is P-type, and the source and drain regions 4 and 5 are N$^+$-type. A gate structure is aligned over a channel region defined between the source and drain regions 4 and 5. The gate structure includes a floating gate I and a control gate 2. Although not shown, a tunneling dielectric layer is interposed between the floating gate 1 and the surface of the substrate P-sub, and another thin oxide layer (or control dielectric) is interposed between the floating gate 1 and the control gate 2. In the illustrated example, the drain voltage Vd is supplied from a bit line BL, the control gate voltage Vcg is supplied from a word line WL, and the source voltage Vs is connected to a reference potential such as ground.

The threshold voltage (or voltages) of the flash memory cell transistor defines its stored logic value. That is, in the example of a single-level cell (SLC) transistor, when the flash memory cell transistor is in its initial state (also called an "erased" state), the threshold voltage Vth is relatively low as shown in FIG. 1C. In this state, the memory cell transistor is designated to have a logic value "1", which generally corresponds to the ON state of a conventional transistor device. On the other hand, when the memory cell transistor is in its "programmed" state (PGM), the threshold voltage Vth is relatively high. This high threshold voltage state is designated to have a logic value "0", which generally corresponds to the OFF state of a conventional transistor device.

In order to change (program) the memory cell transistor from its initial state to its programmed state, a process known as Fowler-Nordheim (FN) tunneling is utilized. Briefly, a relatively large positive potential difference is created between the control gate 2 and the substrate P-sub, and excited electrons within the channel on the surface of the substrate are caused to be pushed through and trapped in the floating gate 1. These negatively charged electrons act as a barrier between the control gate 2 and channel on the substrate, thus increasing the threshold voltage of the memory cell transistor as represented in FIG. 1C. The memory cell transistor can be brought back to its initial state by forming a large negative potential difference between the control gate 2 and the substrate P-sub, whereby resultant FN tunneling draws the trapped electrons back across the thin oxide layer between the floating gate 1 and substrate, thus removing the electron barrier and decreasing the threshold voltage Vth.

Multi-bit cell (MLC) nonvolatile memories are characterized by utilizing each memory cell transistor to store two or more bits of data simultaneously. FIG. 2 is a diagram for explaining the operation of an exemplary two-bit nonvolatile memory cell transistor. Referring to FIG. 2, the threshold voltages Vth of the large numbers of flash memory cell transistors found in flash memory devices generally exhibit bell curve distributions due to random variations in device characteristics. These random variations can be caused, for example, by ordinary manufacturing process margins.

In the example of FIG. 2, the memory cell can be set in any one of four (4) different threshold distribution states, i.e., a first state, a second state, a third state and a fourth state. Any memory cell transistor having a threshold voltage within the distribution defined by one of these four states is assigned a corresponding two-bit logic value, for example, "11", "10", "00" and "01" as shown in FIG. 2.

The particular bit assignments illustrated in FIG. 2 are known in the art as "gray-coding." Under gray-coding bit assignments, the two-bit logic values of adjacent states only differ in one bit. Gray-coding can be useful, for example, where charges leak from a flash memory cell transistor, reducing the transistor cell's threshold voltage. Because a reduction of the memory cell's threshold voltage from one state to another only changes the memory cell's logic value by one bit, gray-coding reduces the average number of bit errors per cell.

As mentioned above, a memory cell transistor is said to be "programmed" when its threshold voltage is increased from its normally ON state (its erased state) to a threshold voltage of a higher state. In FIG. 2, the threshold voltage distribution to the far left of the diagram ("11") is the erased state.

In the drawings, the threshold voltage distribution representing the erased state "11" is delimited at an upper boundary by a dotted line indicating a verify read voltage V0. Verify read voltage V0 is the level of a voltage applied to the memory cell to verify that it is properly erased. An operation used to determine whether a memory cell's threshold voltage is above a verify read voltage is called a verify read operation. For example, after an erase operation is performed on a memory cell, the memory cell's threshold voltage is compared to verify read voltage V0. If the memory cell's threshold voltage is lower than verify read voltage V0, the memory cell has been successfully erased. Otherwise, the memory cell must be further erased.

Similarly, threshold voltage distributions representing programmed states are delimited at lower boundaries by dotted lines indicating verify read voltages V1, V2, and V3. Verify read voltages V1 through V3 are used to ensure that when a program operation is performed on a memory cell, the memory cell's threshold voltage increases above a minimum level. For example, after a program operation is performed on a memory cell, the memory cell's threshold voltage is compared with one of verify read voltages V1 through V3. If the memory cell's threshold voltage is greater than the verify read voltage, the memory cell has been successfully programmed. Otherwise, the memory cell must be further programmed.

One reason for requiring that each programmed state of a memory cell has at least a minimum threshold voltage is to create adequate sensing margins for distinguishing between adjacent states. The term "sensing margin" here refers to a distance between adjacent threshold voltage distributions that can be used to differentiate between the states represented by the distributions. Typically, adequate sensing margins are more difficult to attain as the number of programmed states represented by a nonvolatile memory device increases. Usually, this is because the programmed states are represented within a limited voltage range, and therefore the corresponding population of threshold voltage distributions within that limited range has to be relatively dense.

As examples of typical sensing margins and threshold voltage distributions, FIGS. 3A and 3B are graphs showing empirical threshold voltage distributions of one-bit and two-bit nonvolatile memory cells, respectively. These graphs were originally disclosed as examples in an article entitled "Intel StrataFlash Memory Technology Development and Implementation," by A. Fazio, Intel Technology Journal, Q4'97.

Referring to FIG. 3A, the threshold voltage distributions of the one-bit memory cells are separated by a sensing margin of about 2V between 3.1 and 5.2V, and the threshold voltage distribution of the programmed state has a width of about 0.7V between 5.2V and 5.9V. The relatively large sensing margin allows the states of these one-bit memory cells to be reliably detected in a read operation by applying a read voltage to the memory cells with a value near the middle of the sensing margin. By comparison, the threshold voltage distributions of the two-bit memory cells of FIG. 3B are more densely grouped than those of FIG. 3A. However each pair of adjacent threshold voltage distributions is separated by a sensing margin large enough to reliably distinguish between the states represented by the distributions.

In order to maintain adequate sensing margins between adjacent threshold voltage distributions, it is necessary to regulate both lower and upper bounds of each threshold voltage distribution. A common technique used to regulate both the lower and upper bounds on the threshold voltage distributions of nonvolatile memory cells is a technique known as incremental step pulse programming (ISPP).

In ISPP, a program voltage is applied to the control gate of a selected memory cell using short successive program pulses of increasing magnitude. Between each pulse, a program verify operation is performed to check whether the selected memory cell's threshold voltage has risen above a program verify voltage level. The ISPP process does not terminate until the selected memory cell's threshold voltage rises above the program verify voltage level.

By requiring the selected memory cell's threshold voltage to exceed the program verify voltage level, the ISPP process effectively controls the lower bound of the threshold voltage distribution for each programmed state of the selected memory cell. On the other hand, by applying the program voltage to the control gate in short pulses, the ISPP process prevents the threshold voltage of the selected memory cell from increasing significantly beyond the program verify voltage level, thereby maintaining a reasonable upper bound on the threshold voltage distribution for each programmed state of the selected memory cell.

FIG. 4 shows an example of a conventional ISPP process used to program memory cells in a NAND flash memory device. In particular, FIG. 4A illustrates a sequence of program pulses to be applied to the control gate of a selected memory cell; FIG. 4B illustrates the compression of the threshold voltage distributions of memory cells as first, second, and third program pulses are applied to the memory cells; and, FIG. 4C illustrates steps performed in the conventional ISPP process.

Referring to FIGS. 4A through 4C, an initial pulse of 15V is applied for 30 μs to a selected memory cell having an initial threshold voltage below −1V (Step S1). The initial pulse increases the threshold voltage of the selected memory cell to within a $1^{st}$ threshold voltage distribution illustrated in FIG. 4B. Next, a verify read operation is performed using 1V as the verify read voltage to determine whether the selected memory cell is adequately programmed (Step S2). If the threshold voltage of the selected memory cell is greater than 1V, the ISPP process is completed (Step S5). Otherwise, an incremented pulse is applied to the selected memory cell to increase the threshold voltage of the cell to within a $2^{nd}$ threshold voltage distribution illustrated in FIG. 4B (Step S4). Steps S2 through S4 are repeated until the threshold voltage of selected memory cell is within a $3^{rd}$ threshold voltage distribution illustrated in FIG. 4B.

The programming of the two-bits in a two-bit memory cell is generally carried out in two successive program operations, including a LSB program operation and a MSB program operation.

Examples of the LSB and MSB program operations are described below with reference to FIGS. 5-7.

Note first that the memory cell transistor is initially in its erased state, and accordingly, its initial logic value is "11" (FIG. 2). In this example, if the LSB of the data to be stored is "0", then a program operation is executed to increase the threshold voltage of the memory cell transistor from the first state to the second state (FIG. 5). On the other hand, if the LSB of the data to be stored is "1", no programming is executed during the LSB program operation. Note here that the memory cell transistor is either in the first state or the second state after the LSB program operation.

Next, the MSB of the data to be stored dictates operations in the MSB program operation. FIG. 6 illustrates the case where gray-coding has been adopted. Regardless of whether the memory cell transistor is in the first state or the second state after the LSB program operation, no programming is executed in the MSB program operation if the MSB of the data to be stored is "1". On the other hand, if the MSB of the data to be stored is "0", then programming occurs which is dependent on whether the memory cell transistor is in the first state or the second state after the LSB program operation. This is shown by the dashed lines appearing in FIG. 6. If the MSB of the data to be stored is "0", and if the memory cell transistor is in the first state after the LSB program operation, then programming is executed to bring the threshold voltage of the memory cell transistor from the first state to the fourth state. On the other hand, if the MSB of the data to be stored is "0", and if the memory cell transistor is in the second state after the LSB program operation, then programming is executed to bring the threshold voltage of the memory cell transistor from the second state to the third state.

FIG. 7 is similar to FIG. 6, except that binary coding has been adopted. In this case, the first through fourth threshold voltage states designate two-bit values of "11", "10", "01"

and "00". Again, regardless of whether the memory cell transistor is in the first state or the second state after the LSB program operation, no programming is executed in the MSB program operation if the MSB of the data to be stored is "1". On the other hand, if the MSB of the data to be stored is "0", then programming occurs which is dependent on whether the memory cell transistor is in the first state or the second state after the LSB program operation. This is shown by the dashed lines appearing in FIG. 7. If the MSB of the data to be stored is "0", and if the memory cell transistor is in the first state after the LSB program operation, then programming is executed to bring the threshold voltage of the memory cell transistor from the first state to the third state. On the other hand, if the MSB of the data to be stored is "0", and if the memory cell transistor is in the second state after the LSB program operation, then programming is executed to bring the threshold voltage of the memory cell transistor from the second state to the fourth state.

Reading of the multi-bit nonvolatile memory will be described next with reference to FIGS. 8 and 9. In particular, FIG. 8 illustrates a LSB read operation in which the logic value of the LSB of the stored data is determined and FIG. 9 illustrates a MSB read operation in which the logic value of the MSB of the stored data is determined. The LSB read operation involves a first LSB read operation and a conditional second LSB read operation. In the first LSB read operation, a first read voltage Vread1 is applied to the word line of the memory cell transistor. If the memory cell transistor is turned ON as a result, then the memory cell transistor must be in the first state ("11"). If the memory cell transistor remains OFF, then a second LSB read operation is executed by applying a second read voltage Vread2 to the word line of the memory cell transistor. Here, if the memory cell transistor remains OFF during the second LSB read operation, the memory cell transistor must be in the fourth state ("01"). On the other hand, if the memory cell transistor turns ON during the second LSB read operation, then the LSB of the stored data is "0", but the MSB of the stored data remains unknown.

In the case of gray-coding, the MSB of the stored data can be detected by a single read operation. This is illustrated in FIG. 9 where the read operation is conducted by applying the third read voltage Vread3 to the word line of the memory cell. If the memory cell transistor turns ON, the MSB of the stored data is "1". If the memory cell transistor remains OFF, the MSB of the stored data is "0".

FIG. 10 is a block diagram showing an example of a nonvolatile semiconductor memory device adapted to carry out the above read and program operations. The example shown in FIG. 10 is intended to reflect at least one way of partitioning the functions performed by the nonvolatile semiconductor memory device in read and program operations. However, the actual implementation of these functions in hardware and/or software can vary widely, and is not necessarily constrained by the organization of the blocks shown in FIG. 10.

Referring to FIG. 10, the nonvolatile semiconductor memory device comprises a memory cell array MCARR and a control circuit CTCON. Memory cell array MCARR comprises a matrix array of memory cells, word lines WL and bit lines BL. Control circuit CTCON comprises a row decoder 100, a page buffer circuit 200, an input/output (I/O) unit 300, a column decoder 400, and an interface and control unit 500.

The operation of memory cell array MCARR and control circuit CTCON in read and program operations is explained below.

In a read or program operation, interface and control unit 500 receives a command and an address from a host system through I/O unit 300. Interface and control unit 500 decodes the address to generate a row address signal RADD and a column address signal CADD for selecting memory cells to be read or programmed. Row address signal RADD is sent to row decoder 100 and column address is sent to column decoder 400. Row decoder 100 activates word lines in memory cell array MCARR based on row address signal RADD, and column decoder 400 sends column address signal CADD to page buffer circuit 200. Page buffer circuit 200 activates bit lines in memory cell array MCARR based on column address signal CADD, and the activated word lines and bit lines select one or more memory cells of memory cell array MCARR.

In a read operation, read data stored in the selected memory cells is loaded into page buffer circuit 200 and then transferred to the host system through I/O unit 300. In a program operation, write data is transferred from the host system to page buffer circuit 200 through I/O unit 300 and then the write data is stored in the selected memory cells from page buffer circuit 200.

In addition to generating row and column addresses RADD and CADD, control and interface unit 500 also generates various control signals to manipulate the functions and timing of row decoder 100, column decoder 400, I/O unit 300, page buffer circuit 200, and memory cell array MCARR.

FIGS. 11 and 12 are schematic diagrams illustrating an exemplary arrangement of the memory cells in memory cell array MCARR. The arrangement of memory cells in FIGS. 11 and 12 is characteristic of a NAND flash memory. For instance, NAND flash memories are characterized by serially connected strings of flash memory cell transistors, where multiple parallel strings constitute a memory block of the flash memory, and memory cells connected to the same word line WL constitute a page of the flash memory. Each string comprises a plurality of flash memory cell transistors connected in series along a bit line BL in the memory block, and word lines WL are connected to the control gates of each respective row of memory cell transistors in the memory block. A typical flash memory device may contain, for example, 16 or 32 cell transistors in each string, and 4096 strings (B/L0 . . . B/L4095) in each memory block.

In the example shown in FIG. 12, memory cell array MCARR includes 4096 blocks of memory cells, wherein each block comprises 32 pages and each page comprises 512 bytes, or 4096 memory cells. Accordingly, the total capacity of memory cell array MCARR is 512 Mbit.

In FIGS. 11 and 12, memory cell array MCARR includes pairs of strings of memory cells. Each string in each pair stores and outputs data through a respective even bit line BLe or odd bit line BLo. That is, according to the example shown in FIGS. 11 and 12, each bit line BL is made up of an even bit line BLe and an odd bit line BLo. Additionally, each page in memory cell array MCARR can be divided into an even page comprising cells connected to even bit lines and an odd page comprising cells connected to odd bit lines.

String select transistors are located at opposite ends of each string. The string select transistors have control gates receiving a string select signal SSL and a ground select signal GSL, respectively. Generally, select signals SSL and GSL are utilized in reading and programming of the memory cell transistors. Further, at the end of each string is a common source line CSL which sets a source line voltage of the memory cell transistor strings of each memory block. Select signals SSL and GSL are supplied from row decoder 100, along with word line signals WL<1:32> applied to wordlines WL.

Unfortunately, as the density of memory cells in a nonvolatile semiconductor memory device increases, electrical interactions between adjacent memory cells can begin to have a significant impact on the memory cells' performance. One such type of electrical interaction is known as "floating gate coupling".

Floating gate coupling occurs where the floating gates of adjacent memory cells exert a capacitive influence on each other. For example, FIG. 13 shows a pair of adjacent memory cells where one of the memory cells is programmed and the other is not. A voltage from charges stored in the floating gate of the programmed memory cell is coupled to the floating gate of the un-programmed cell, causing the threshold voltage of the un-programmed cell to change. As a result, the memory cell's threshold voltage distribution becomes broader.

For example, FIG. 14 illustrates an original threshold voltage distribution for memory cells programmed using an ISPP process and a subsequent threshold voltage distribution of the memory cells after one or more adjacent memory cells are programmed. As seen in FIG. 14, the width of the original threshold voltage distribution is 0.2V and the width of the subsequent threshold voltage distribution is 0.6V. In other words, programming the adjacent memory cells tends to widen the original threshold voltage distribution.

FIG. 14 also illustrates the effects of other types of electrical interference on the threshold voltage distribution of a memory cell. For example, noise on the common select line (CSL) can affect the detected threshold voltage of memory cells during read verify operations, causing the threshold voltage to be higher or lower than desired. In addition, the states of other cells in the same string, or background pattern dependency (BPD), can also affect the threshold voltage distribution of a memory cell. However, as demonstrated by FIG. 14, floating gate coupling tends to have a relatively large effect on the threshold voltage of a memory cell compared with CSL noise and BPD.

The broadening of the threshold voltage distributions of a memory cell due to floating gate coupling tends to decrease the sensing margins of the memory cell. As a result, floating gate coupling tends to make memory cells more error prone—especially memory cells with relatively densely packed threshold voltage distributions, such as multi-bit memory cells.

In order to prevent such errors from occurring, a variety of techniques have been proposed for addressing the effects of floating gate coupling in nonvolatile memory devices. Several of these techniques are explained below with reference to FIGS. 15 through 22.

FIGS. 15 and 16 illustrate a technique known as shadow programming, re-programming, or compensation programming. In this technique, a memory cell is programmed to compress, elevate, or otherwise reshape its threshold voltage distribution to compensate for electrical effects such as floating gate coupling.

For example, FIGS. 15A and 15B illustrate one type of compensation programming operation. The compensation programming operation of FIGS. 15A and 15B is performed on first and second pages of memory cells in a NAND flash memory device. However, for simplicity of illustration, only one memory cell of each page is shown in the drawings. The first page is labeled "$1^{st}$ Set" and the second page is labeled "$2^{nd}$ Set". Referring to FIGS. 15A and 15B, the first page is programmed using a first read verify voltage, and then the second page is also programmed using the first read verify voltage. After the second page is programmed using the first read verify voltage, the first page is programmed using a second read verify voltage.

FIG. 16 illustrates another type of compensation programming operation performed when successively programming memory cells within the same page of a NAND flash memory device. The operation illustrated in FIG. 16 is disclosed in U.S. Pat. No. 6,522,580, filed on Jun. 27, 2001. In the compensation programming operation illustrated in FIG. 16, the threshold voltage distribution of a memory cell is compressed prior to programming adjacent memory cells so that when the adjacent memory cells are programmed, the threshold voltage distribution does not become overly broad due to floating gate coupling.

Referring to FIG. 16, the NAND flash memory device comprises memory cells 41 through 43, each storing two bits of data. Each of memory cells 41 through 43 is programmed by programming a first bit of data and then programming a second bit of data. The first and second bits of data in memory cells 41 through 43 are labeled as "pages" (0,2), (1,3), and (0,2), respectively. The pages of memory cells 41 through 43 are programmed in an order 0, 0, 2, 2,1, 3. For purposes of this explanation, there is no need to distinguish between the respective pages 0 and 2 of memory cells 41 and 43.

When pages 0 and 2 of memory cells 41 and 43 are programmed, the threshold voltage of memory cell 42 in the erased state "11" may increase due to floating gate coupling, as indicated by a dotted line. However, if memory cell 42 is programmed to a higher state, the final threshold voltage distribution of memory cell 42 will not be broadened due to floating gate coupling since memory cells 41 and 43 will not undergo any further programming after memory cell 42 is programmed.

After pages 0 of memory cells 41 and 43 are programmed, the resulting threshold voltage distributions 51 are compressed to intermediate threshold voltage distributions 52. Next, pages 2 of memory cells 41 and 43 are programmed, followed by pages 1 and 3 of memory cell 42. When pages 1 and 3 of memory cell 42 are programmed, the threshold voltage distributions of memory cells 41 and 43 broaden into threshold voltage distributions 53.

FIGS. 17 through 20 illustrate another technique used to address problems arising from floating gate coupling. The technique illustrated in FIGS. 17 through 20 uses a flag cell to indicate whether or not a most significant bit (MSB) of a two-bit memory cell has been programmed. For example, where the MSB has been programmed, the flag cell typically stores logic value "0" and where the MSB has not been programmed, the flag cell typically stores logic value "1".

The logic value of the flag cell is used in a read operation to determine a correspondence between a detected threshold voltage distribution of the memory cell and the logic value of stored data in the memory cell. For instance, depending on whether the flag cell stores logic value "1" or "0", the memory cell may store logic value "10" using a first threshold voltage distribution or a second threshold voltage distribution higher than the first threshold voltage distribution.

FIGS. 17A and 17B illustrate an example of the above technique in a two-bit memory cell. In particular, FIG. 17A illustrates a program operation for a least significant bit (LSB) of the memory cell, and FIG. 17B illustrates a program operation for a MSB of the memory cell.

Referring to FIG. 17A, a flag cell is initially set to logic level "1" and the LSB of the memory cell is programmed. If the LSB is programmed to logic level "0", then the memory cell transitions from a first state represented by a first threshold voltage distribution to an intermediate state represented by an intermediate threshold voltage distribution, as illustrated by a broken arrow. Otherwise, the memory cell remains in the first state.

When the LSB is programmed, the flag cell remains at logic level "1". As long as the flag cell is at logic level "1," the intermediate state represents logic level "10" and the first state represents logic level "11". Accordingly, if the flag cell stores logic level "1", the LSB can be read by applying a read voltage to the memory cell with a value between the first threshold voltage distribution and the intermediate threshold voltage distribution to determine whether the threshold voltage of the memory cell is above or below the read voltage.

In FIG. 17A, the intermediate threshold voltage distribution is broader than the first threshold voltage distribution. This is to illustrate broadening that occurs in the intermediate threshold voltage distribution due to floating gate coupling when adjacent memory cells are programmed. Before the broadening, the intermediate threshold voltage distribution is approximately the same as a second threshold voltage distribution representing a second state and shown in FIG. 17B. Although not illustrated in FIG. 17A, the first threshold voltage can also broaden due to floating gate coupling when adjacent memory cells are programmed.

Referring to FIG. 17B, the MSB of the memory cell is programmed and the flag cell is set to logic level "0". If the memory cell is in the first state and the MSB is programmed to logic level "1", the memory cell remains in the first state. If the memory cell is in the first state and the MSB is programmed to logic level "0", the memory cell transitions from the first state to the second state as indicated by a broken arrow from the first state to the second state. If the memory cell is in the intermediate state and the MSB is programmed to logic level "1", the memory cell transitions from the intermediate state to a third state represented by a third threshold voltage distribution, as illustrated by a broken arrow from the intermediate state to the third state. Otherwise, if the memory cell is in the intermediate state and the MSB is programmed to logic level "0", the memory cell transitions to a fourth state represented by a fourth threshold voltage distribution, as illustrated by a broken arrow from the intermediate state to the fourth state.

The programming of the memory cell from the intermediate state to the third state in FIG. 17B above can be considered a type of shadow programming, re-programming, or compensation programming because the programming modifies or re-shapes the threshold voltage distribution representing logic value "10" from the intermediate state to the third state.

FIG. 18 illustrates a read operation of a memory cell programmed using the technique illustrated in FIGS. 17A and 17B. In FIG. 18, it is assumed that the flag cell stores logic level "0", indicating that both the LSB and the MSB of the memory cell have been programmed.

Referring to FIG. 18, the logic value of the LSB can be detected by applying a read voltage Vread3 to the memory cell and determining whether the threshold voltage of the memory cell is above or below read voltage Vread3. If the threshold voltage of the memory cell is above read voltage Vread3, the LSB has logic value "0." Otherwise, the LSB has logic value "1".

The logic value of the MSB can be detected by applying a read voltage Vread1 or Vread2 to the memory cell based on the logic value of the LSB. If the LSB has logic value "1", read voltage Vread1 is applied to the memory cell to detect whether the memory cell is in the first state or the second state. Otherwise, if the LSB has logic value "0", read voltage Vread2 is applied to the memory cell to detect whether the memory cell is in the third state or the fourth state. Where the threshold voltage of the memory cell is detected to be greater than read voltage Vread1 or Vread2, respectively, the MSB of the memory cell is detected to have logic value "0". Otherwise, the MSB is detected to have logic value "1".

FIGS. 19A and 19B show a variation of the technique illustrated in FIGS. 17 and 18. The variation shown in FIGS. 19A and 19B is disclosed in U.S. Pat. No. 6,657,891, filed on Feb. 4, 2003. FIG. 19A illustrates a program and read operation for the LSB of a memory cell and FIG. 19B illustrates a program and read operation for the MSB of the memory cell.

The program and read operations illustrated in FIGS. 19A and 19B are similar to those illustrated in FIGS. 17and 18, except for the mappings between the threshold voltage distributions and the stored logic values. In particular, first through fourth threshold voltage distributions illustrated in FIG. 19B represent logic values "11", "10", "00", and "01", respectively, whereas the first through fourth threshold voltage distributions illustrated in FIG. 17B represent logic values "11", "10", "01", and "00", respectively.

FIG. 20 illustrates an exemplary memory cell array MCARR and page buffer circuit 200 for implementing the techniques illustrated in FIGS. 17 through 19. Memory cell array MCARR and page buffer circuit 200 shown in FIG. 20 are similar to those shown in FIGS. 11 and 12, except that in FIG. 20, memory cell array MCARR includes a flag cell for each even and odd page of data in memory cell array MCARR, and page buffer circuit 200 includes a flag data storage circuit for storing flag cell data when reading a page of data from memory cell array MCARR. As described above, the logic value of the flag cell data is used to determine the logic value of the data stored in the page of read data.

FIGS. 21 and 22 illustrate a final technique used to address the effects of floating gate coupling in adjacent memory cells of nonvolatile semiconductor memory devices. The technique illustrated in FIGS. 21 and 22 attempts to minimize the effects of floating gate coupling by rearranging the order in which the memory cells are programmed.

The examples shown in FIGS. 21 and 22 illustrate procedures for programming an array of two-bit memory cells. In these procedures, each memory cell is programmed by programming a LSB, represented by a relatively dark shaded oval, and then programming a MSB, represented by a relatively light shaded oval. The order in which the memory cells of FIGS. 21 and 22 are programmed is illustrated in the ovals by the numbers 1 through 10.

In the procedure of FIG. 21, the LSB and MSB of each memory cell are programmed consecutively. For example, the LSB and MSB of a first memory cell "A" are programmed in first and second program operations 1 and 2. Next, the LSB and MSB of a second memory cell horizontally adjacent to first memory cell "A" are programmed in third and fourth program operations 3 and 4. Then, the LSB and MSB of a fourth memory cell vertically adjacent to memory cell "A" are programmed in fifth and sixth program operations. Next, the LSB and MSB of a fourth memory cell horizontally adjacent to the third memory cell are programmed in seventh and eighth program operations. This procedure continues along the length of even and odd bit lines as shown by the numbered ovals in FIG. 21 until a desired set of memory cells are programmed.

Where the procedure illustrated in FIG. 21 is used, the threshold voltage distribution of each memory cell can broaden due to floating gate coupling when programming both the LSB and MSB of adjacent memory cells. To address this problem, the procedure illustrated in FIG. 22 uses a different order for programming the LSB and MSB of the memory cells.

In the procedure of FIG. 22, the MSB of each memory cell is only programmed after the LSB of each adjacent memory cell is programmed. For example, in FIG. 22, the LSB of first memory cell "A" is programmed in a first program operation 1, then the LSB of the second memory cell horizontally adjacent to first memory cell "A" in a second program operation 2. Next, the LSB of the third memory cell vertically adjacent to first memory cell "A" is programmed in a third program operation 3, and then the LSB of the fourth memory cell horizontally adjacent to the third memory cell is programmed in a fourth program operation 4. After the LSB of each memory cell adjacent to first memory cell "A" is programmed, the MSB of first memory cell "A" is programmed in a fifth program operation 5. Next, the MSB of the second memory cell is programmed in a sixth program operation 6. This procedure continues along the length of even and odd bit lines as shown by numbered ovals in FIG. 22 until a desired set of memory cells are programmed.

Because the MSB of each memory cell is programmed only after the LSB of each adjacent memory cell is programmed, the broadening of each memory cell's threshold voltage distribution due to the LSB programming of adjacent memory cells is compensated for when the MSB of the memory cell is programmed. Accordingly, the only floating gate coupling that will broaden a memory cell's threshold voltage distribution is floating gate coupling due to MSB programming of adjacent memory cells.

Although the techniques illustrated in FIGS. 15 through 22 have been shown to significantly reduce the effects of floating gate coupling in multi-bit nonvolatile memory cells, further reduction continues to be necessary as the basic pitch of the memory cells in nonvolatile memory devices continues to decrease.

SUMMARY OF THE INVENTION

One embodiment of the invention provides a method of programming a nonvolatile memory device comprising a plurality of n-valued nonvolatile memory cells arranged in a matrix, wherein n is a natural number greater than or equal to two (2). The method comprises programming i-valued data to three or more memory cells contiguously arranged along a first direction of the matrix before programming (i+1)-valued data to any of the three or more memory cells, wherein i is less than n, and wherein the three or more memory cells are programmed during three or more respectively distinct program periods, and after programming the i-valued data to the three or more memory cells, programming (i+1)-valued data to a particular memory cell among the three or more memory cells.

Another embodiment of the invention provides a method of programming a nonvolatile memory device comprising a plurality of n-valued nonvolatile memory cells arranged in a matrix and further arranged in a plurality of strings, wherein n is a natural number greater than or equal to two (2). The method comprises defining odd and even strings among the plurality of strings and identifying a particular odd string and a corresponding particular even string among the odd and even strings, and programming i-valued data to first and second groups of three or more contiguous memory cells within the particular odd and even strings, respectively, before programming (i+1)-valued data to any memory cells in the first odd and even strings. After the i-valued data is programmed to the first and second groups of three or more contiguous memory cells, (i+1)-valued data is programmed to a particular memory cell among the first and second groups of three or more contiguous memory cells.

Another embodiment of the invention provides a nonvolatile memory device comprising a memory array including a plurality of n-valued memory cells arranged in a matrix, where n is a natural number greater than or equal to two (2). A group of three or more memory cells contiguously arranged along a first direction in the matrix are programmed with i-valued data (i<n) during three or more respectively distinct program periods, before any of the three or more memory cells is programmed with (i+1)-valued data, and then after all of the three or more memory cells are programmed with the i-valued data, a particular memory cell among the three or more memory cells is programmed with (i+1)-valued data.

BRIEF DESCRIPTION OF THE DRAWINGS

The invention is described below in relation to several embodiments illustrated in the accompanying drawings. Throughout the drawings like reference numbers indicate like exemplary elements, components, or steps. In the drawings:

FIGS. 17A and 17B are threshold voltage distribution diagrams illustrating a LSB program operation and a MSB program operation of a two-bit memory cell in a nonvolatile memory device;

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

FIGS. 23 through 27 illustrate various methods of programming the memory cells of a multi-bit nonvolatile memory device according to selected embodiments of the invention. In these methods, the respective least significant bits (LSBs) of several memory cells are programmed before the MSB of any of the memory cells is programmed in order to minimize the effects of floating gate coupling on the final states of the memory cells.

The methods of FIGS. 23 through 27 are illustrated in the context of two-bit NAND flash memories. However, those skilled in the art will recognize that these methods can be alternatively implemented in a variety of different types of nonvolatile memories, including nonvolatile memories storing more than two bits per cell and nonvolatile memories other than NAND flash memories.

Figure 10:
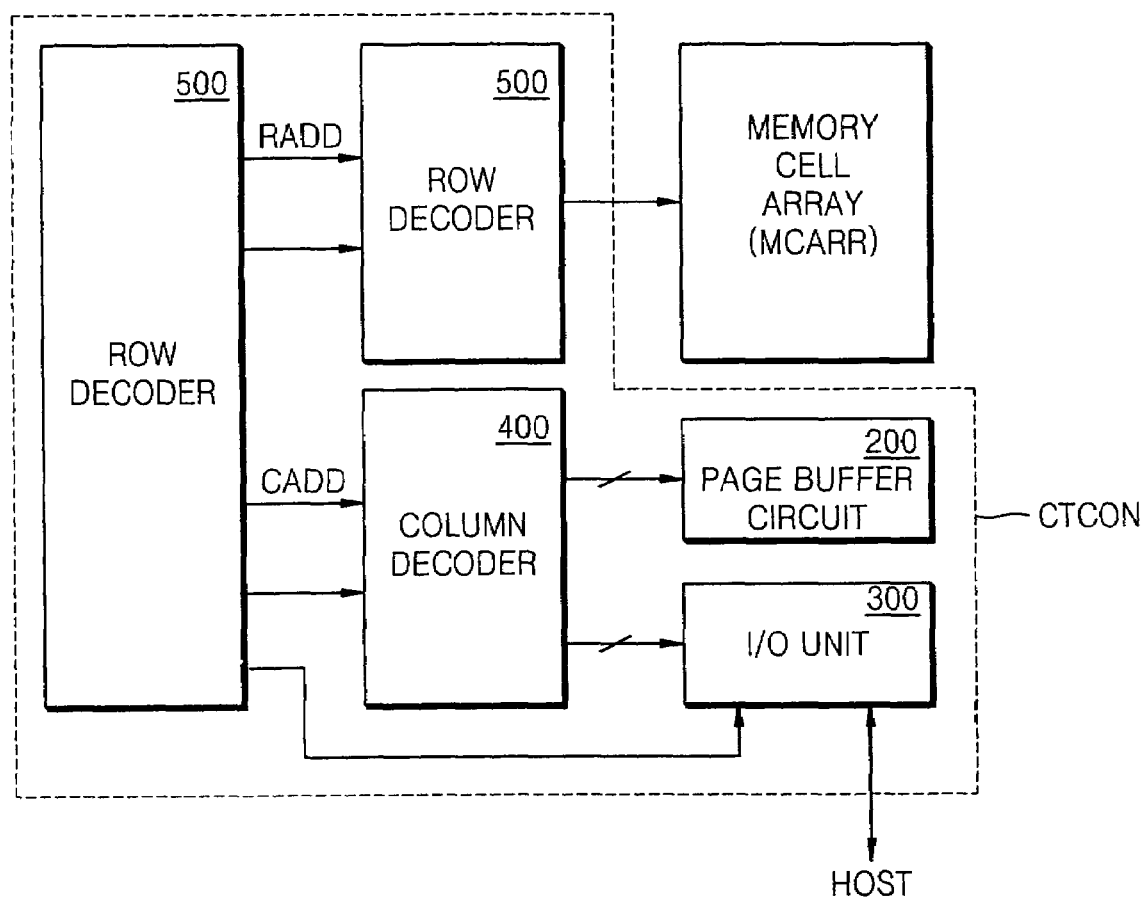
FIG. 10 is a schematic block diagram of a nonvolatile semiconductor memory device.
Figure 11:
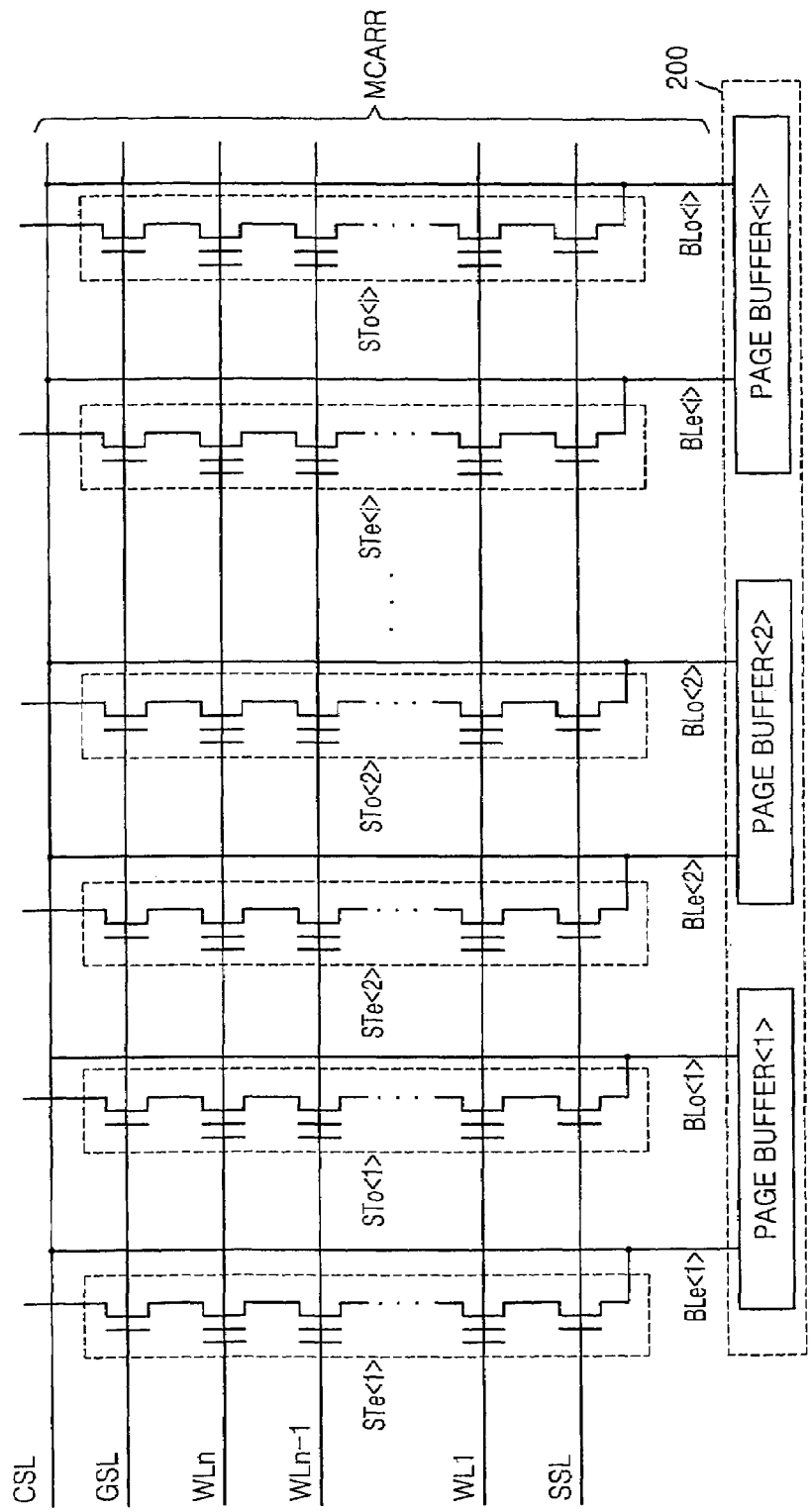
FIG. 11 is a circuit diagram of a memory cell array in a NAND flash memory device.
Figure 12A:
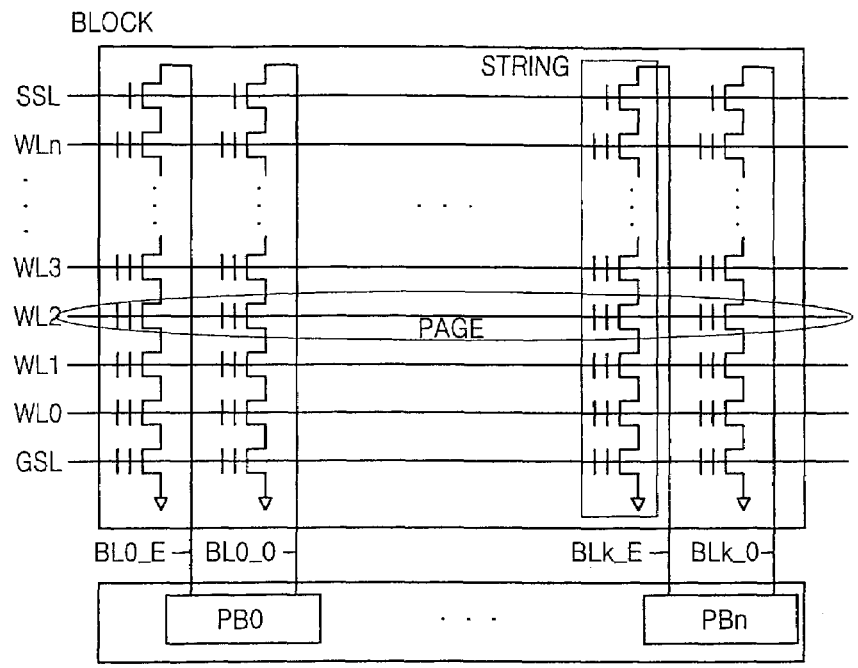
FIGS. 12A and 12B are a circuit diagram and a block diagram of a memory cell array in a NAND flash memory device.
Figure 12B:
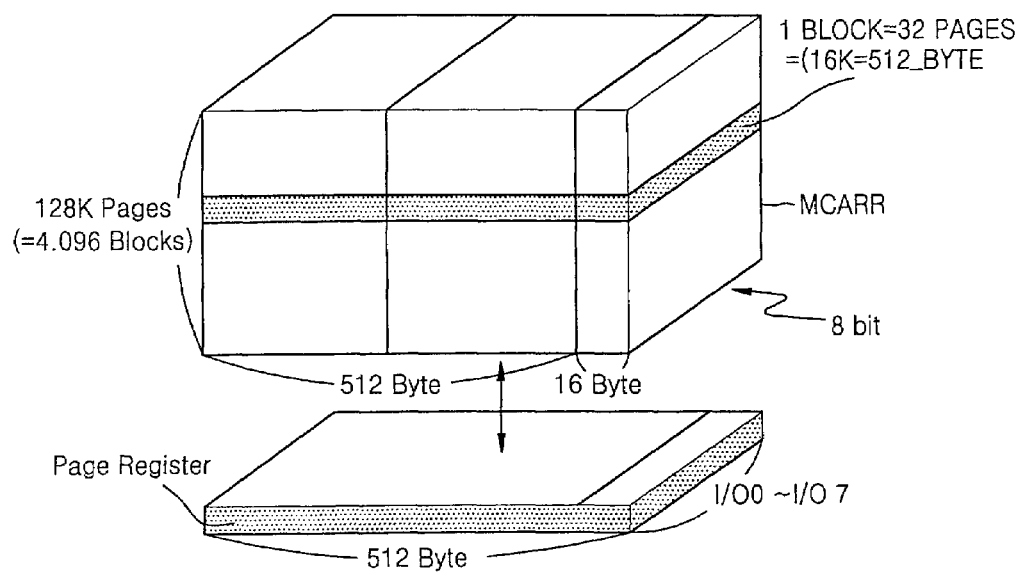
Figure 13:
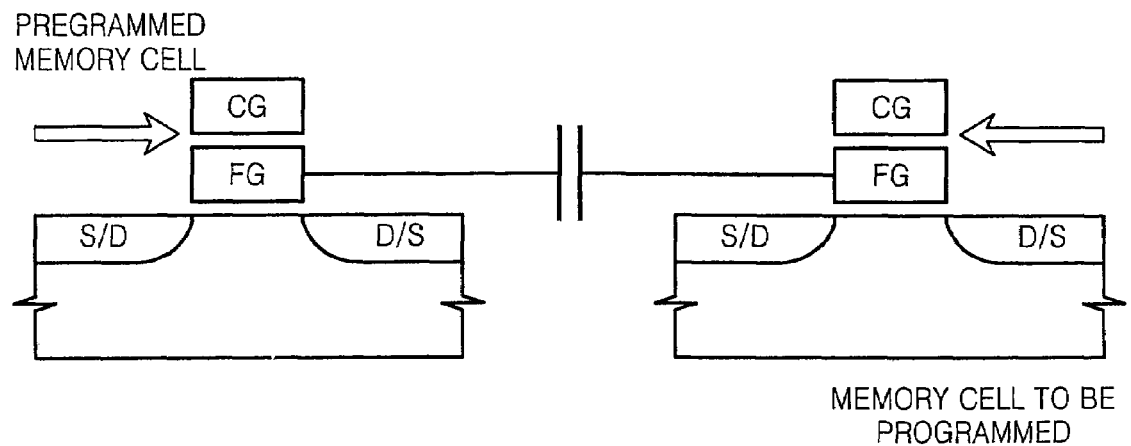
FIG. 13 is a schematic view of a pair of adjacent nonvolatile memory cells and a coupling capacitance between floating gates of the memory cells.
Figure 14:
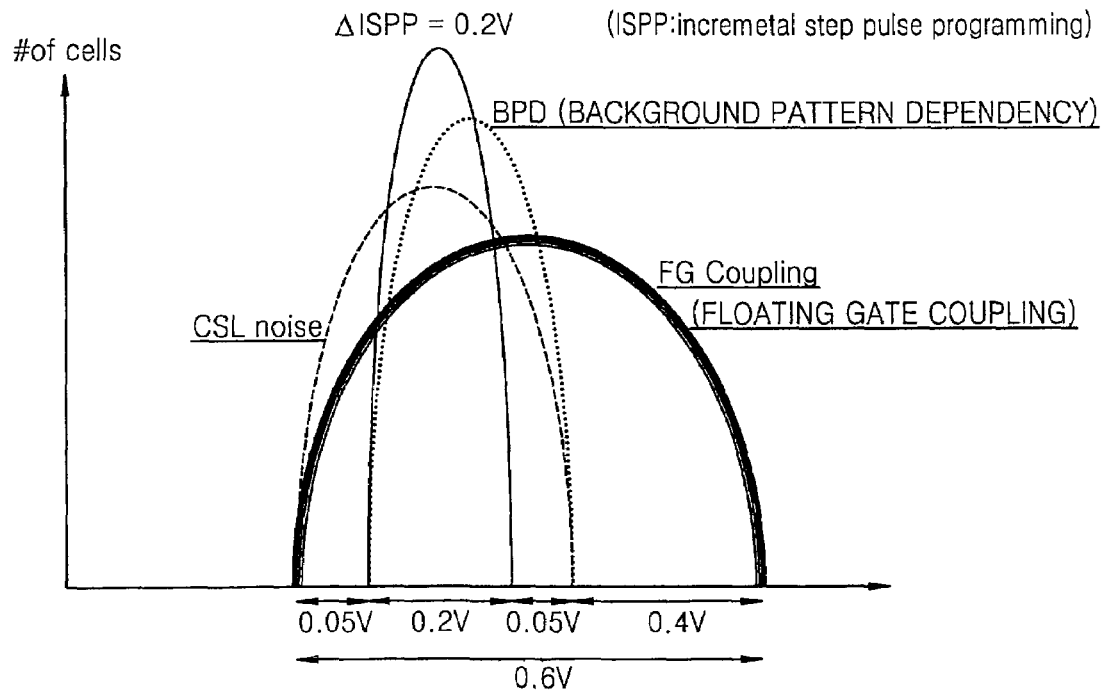
FIG. 14 is a graph illustrating the effects of various electrical interactions between memory cells in a nonvolatile memory device on a threshold voltage distribution of one memory cell in the device.
Figure 15A:
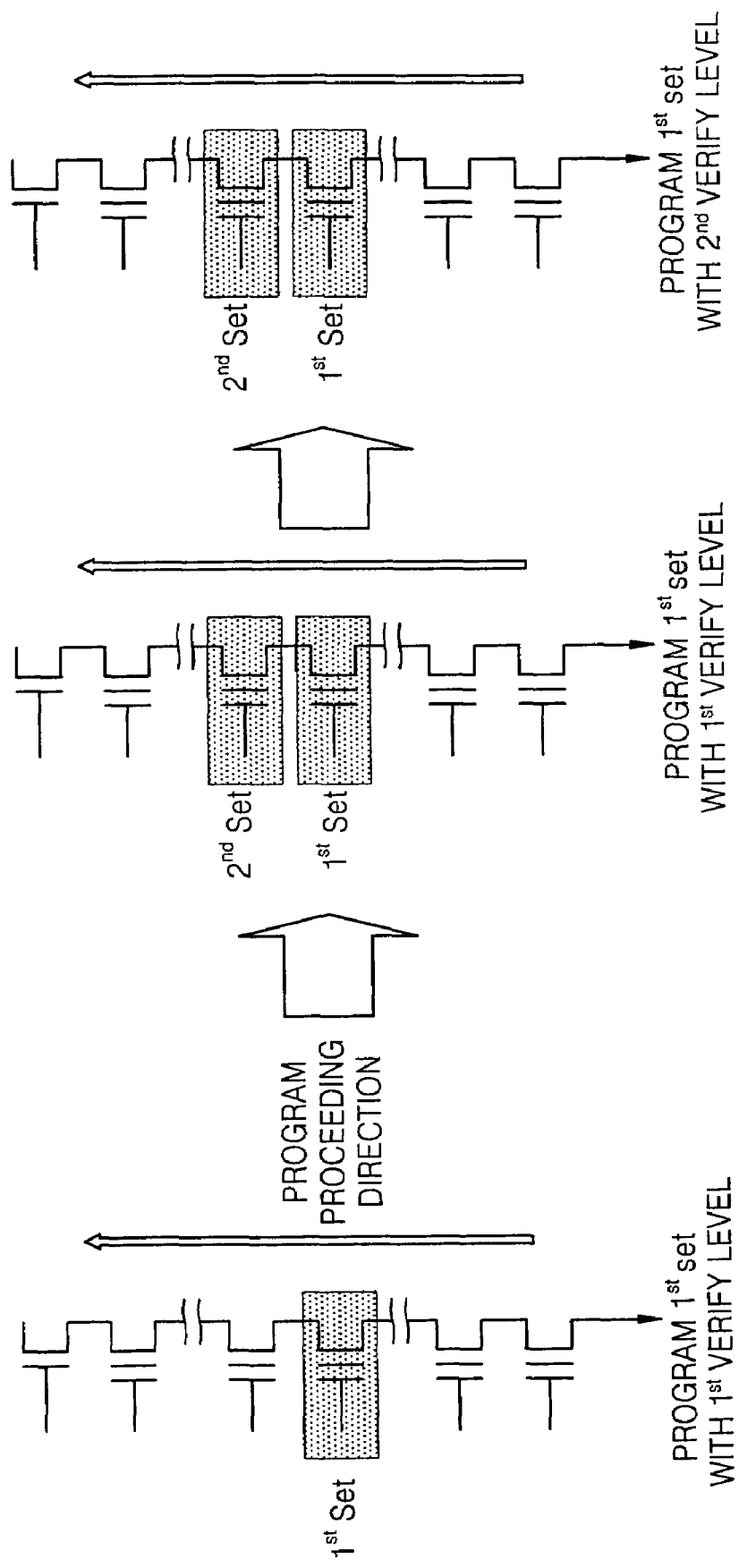
FIGS. 15A and 15B are a circuit diagram and a threshold voltage distribution diagram illustrating a compensation programming method.
Figure 15B:
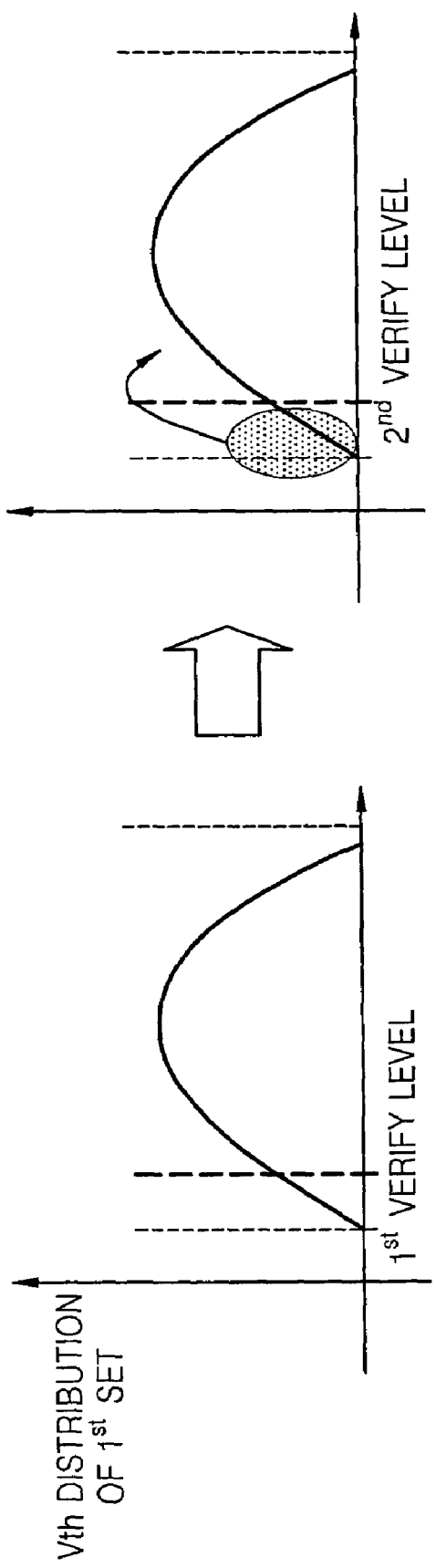
Figure 16:
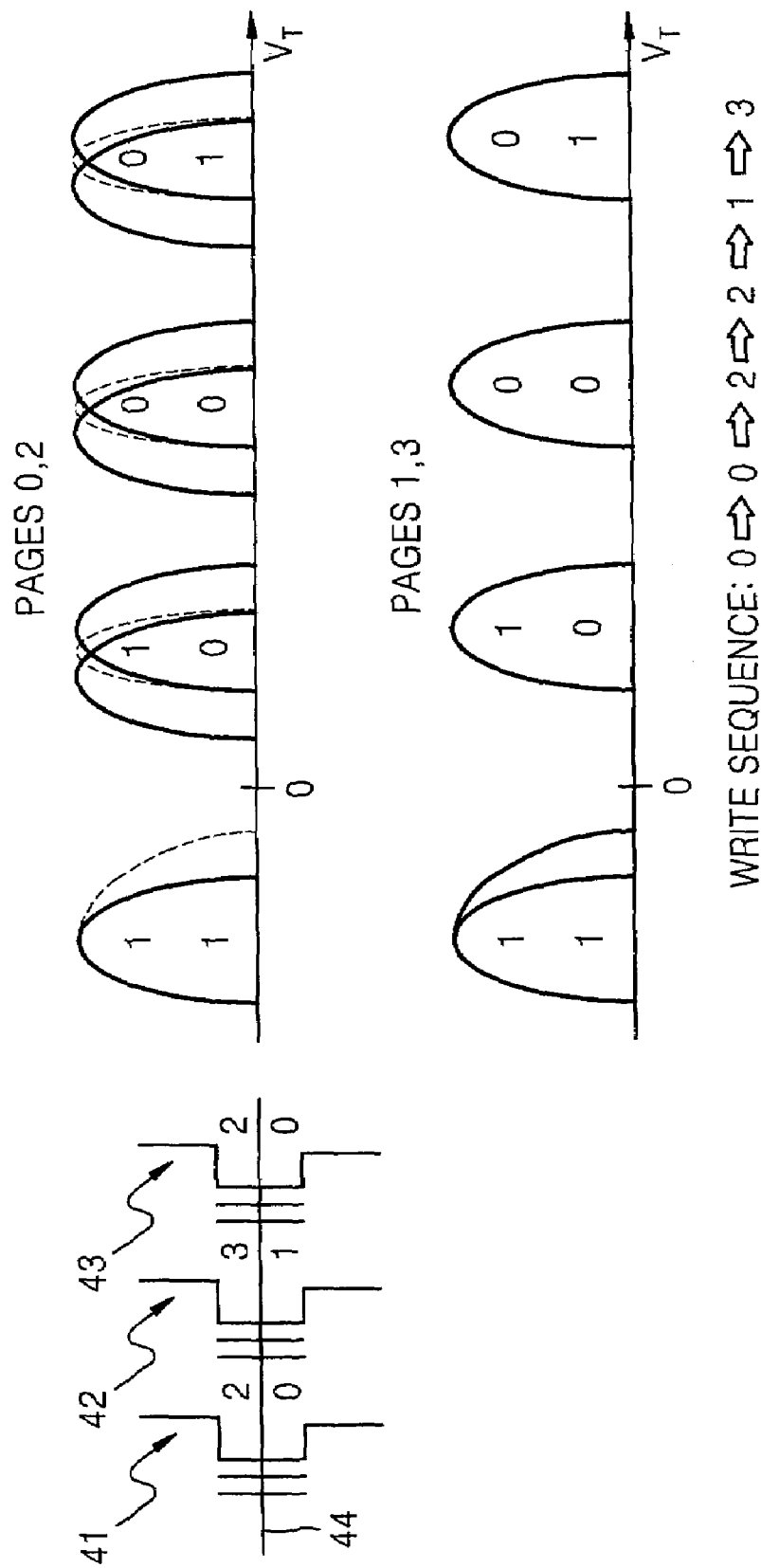
FIG. 16 is a circuit diagram and a threshold voltage distribution diagram illustrating another compensation programming method.
Figure 18:
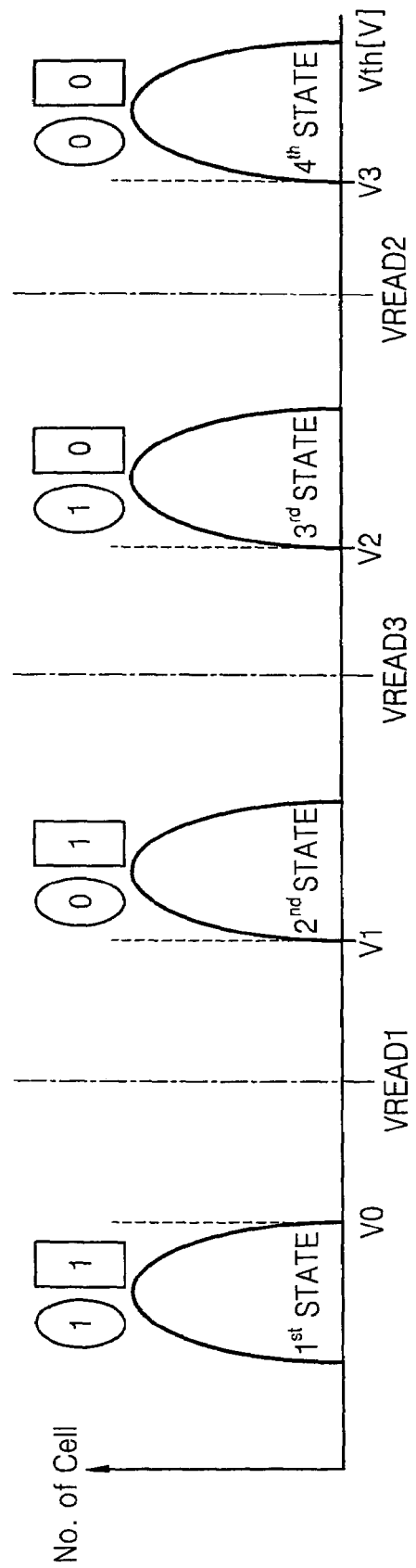
FIG. 18 is a threshold voltage distribution state diagram illustrating a read operation of a two-bit nonvolatile memory device.
Figure 19A:
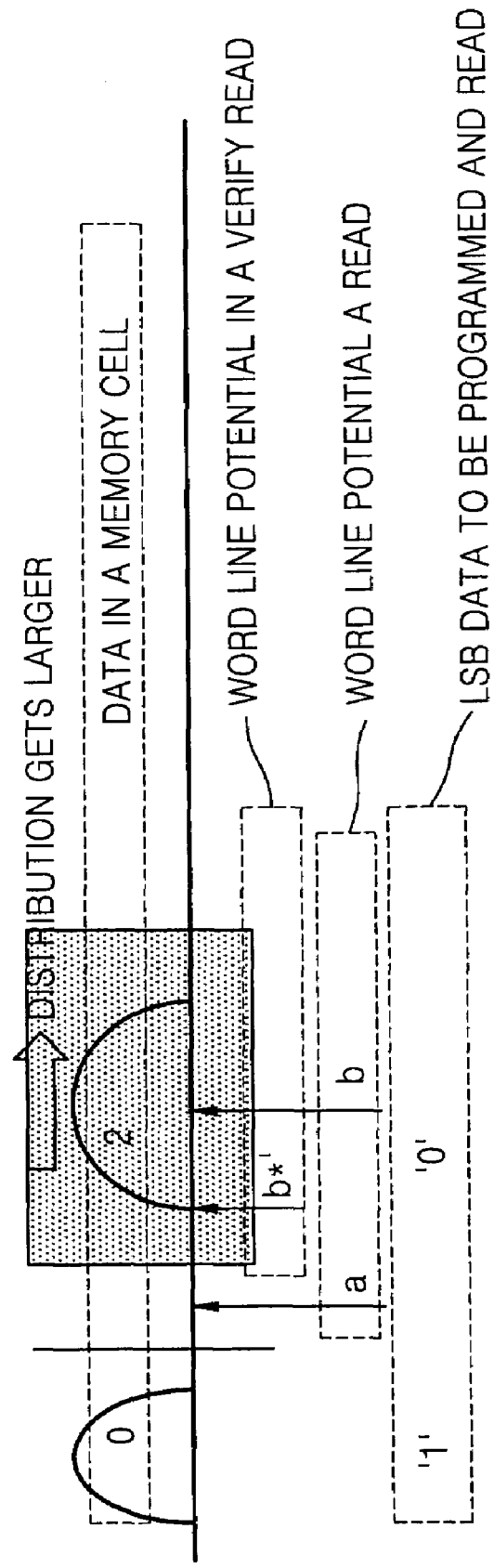
FIGS. 19A and 19B are threshold voltage distribution diagrams illustrating a LSB program operation and a MSB program operation of a two-bit memory cell in a nonvolatile memory device.
Figure 19B:
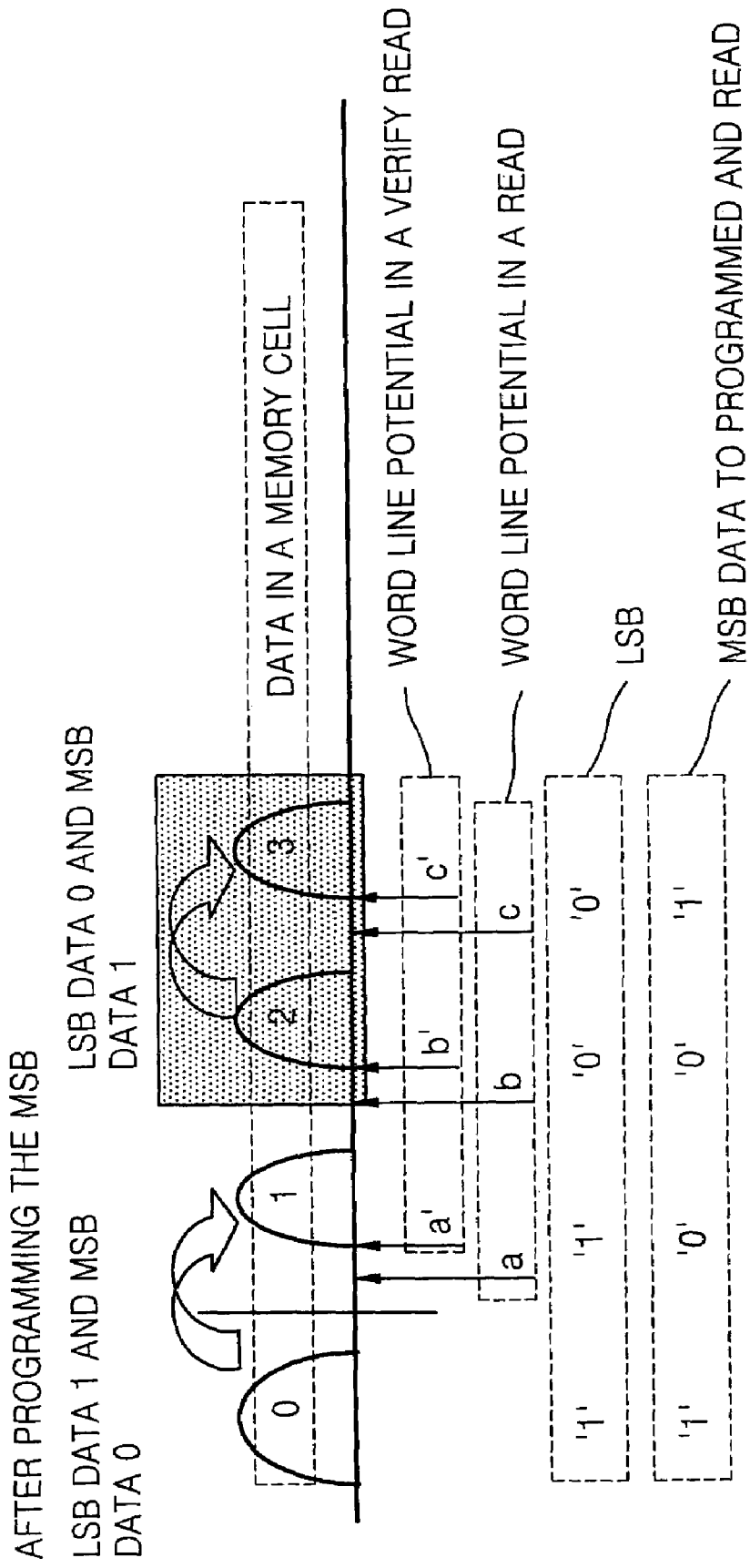

The methods of FIGS. 23 through 27 are typically implemented in a nonvolatile memory device such as that illustrated in FIG. 10. In other words, these methods are generally performed in a memory cell array such as memory cell array MCARR under the control of a control circuit such as control circuit CTCON. In order to implement the methods of FIGS. 23 through 27 using the control circuit of FIG. 10, interface and control unit 500 is changed to alter the way it controls program operations.

FIGS. 23 and 24 illustrate a method of programming the memory cells of a two-bit NAND flash memory device according to one embodiment of the present invention. In the method of FIGS. 23 and 24, the LSB of each memory cell in a pair of adjacent strings is programmed before the MSB of any of the memory cells in the pair of strings is programmed.

Figure 23A:
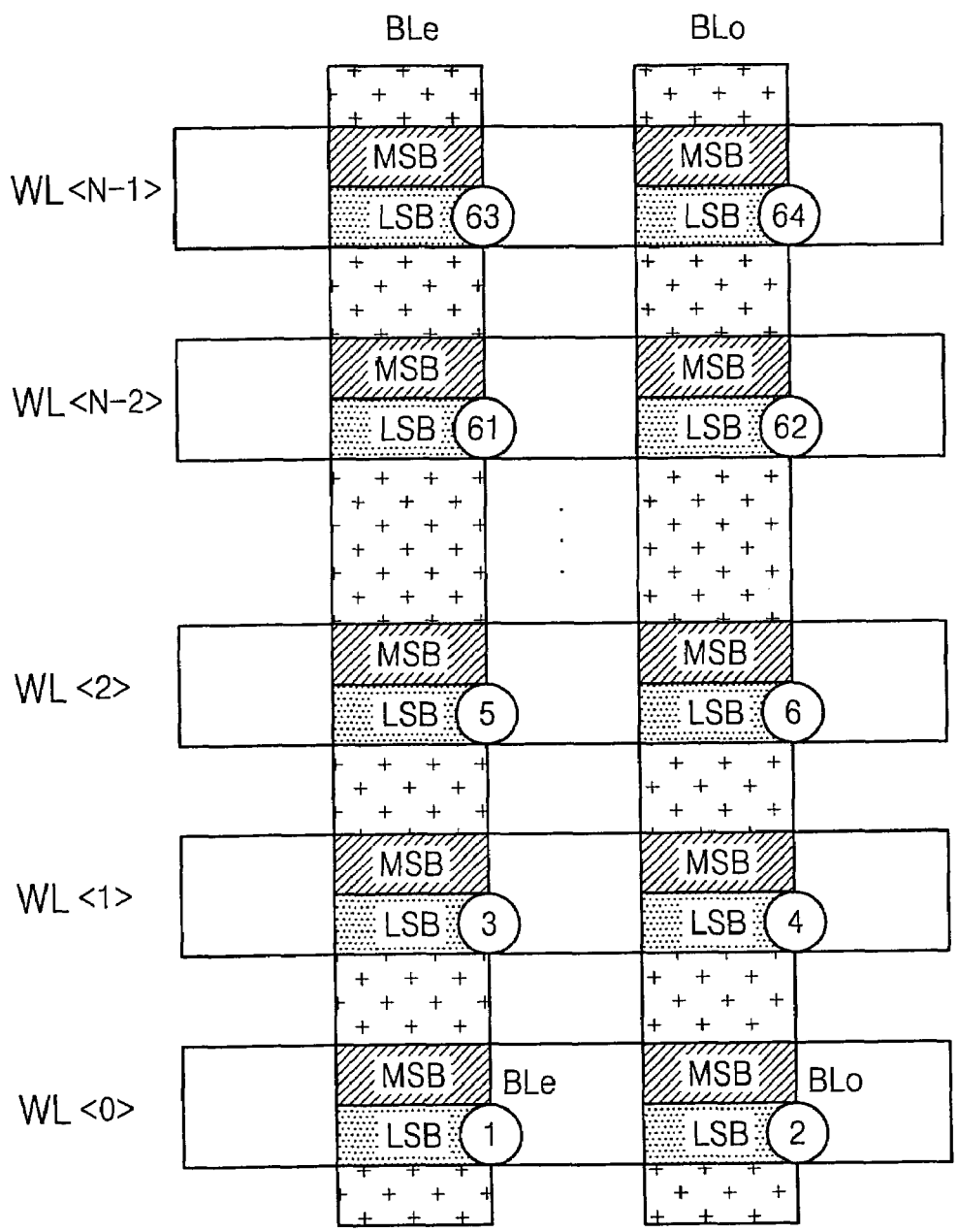
FIG. 23 is a conceptual diagram illustrating an ordering for LSB program operations of a nonvolatile memory device according to an embodiment of the present invention.
Figure 23B:
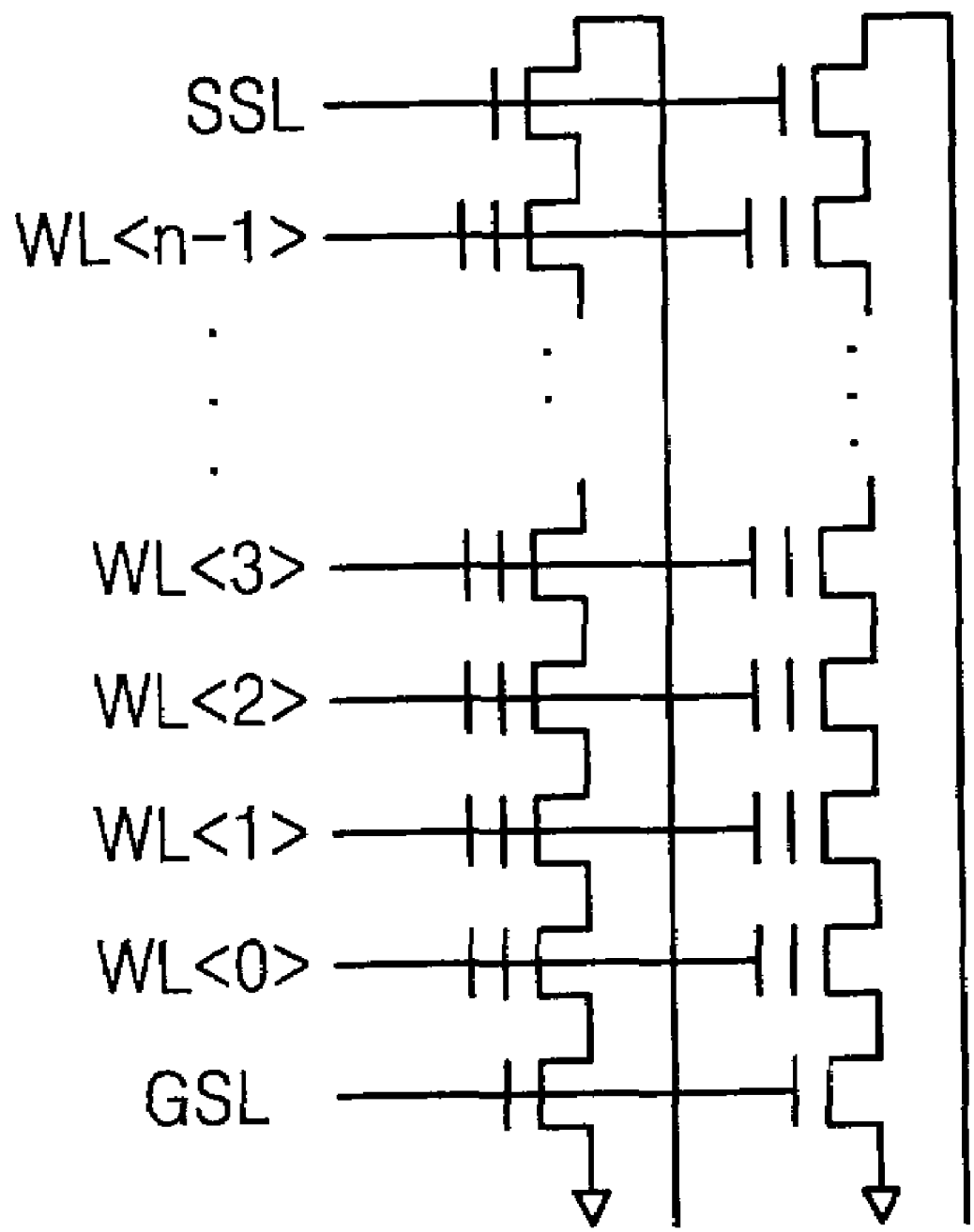
Figure 24A:
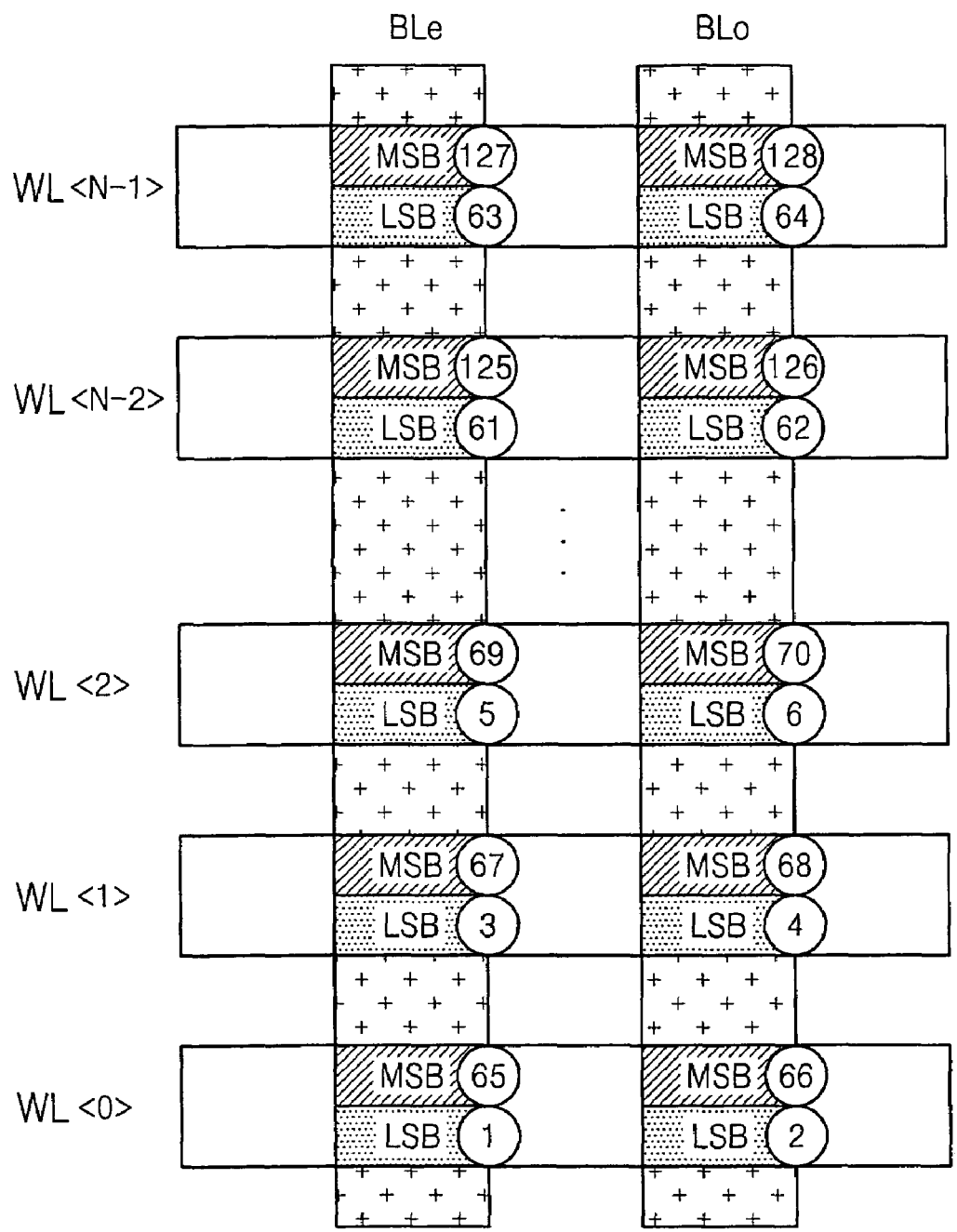
FIG. 24 is a conceptual diagram illustrating an ordering for MSB program operations of a nonvolatile memory device according to an embodiment of the present invention.

The pair of strings is illustrated in a schematic block form in FIGS. 23A and 24A and in a circuit form in FIG. 23B. The pair of strings includes an even string connected to an even bit line BLe and an odd string connected to an odd bitline BLo. Although not illustrated in FIGS. 23 and 24, each memory cell in the even string is typically part of an even page of memory cells connected to the same word line, and each memory cell in the odd string is typically part of an odd page of memory cells connected to the same wordline. The collection of all even and odd pages corresponding to the memory cells shown in FIGS. 23 and 24 constitutes a block of the NAND flash memory device.

Referring to FIG. 23A, the order in which the LSBs of the memory cells are programmed is illustrated by numbered circles. Each of the numbered circles represents a distinct program period during which a cell is programmed. The LSBs of the memory cells in the odd and even strings are programmed in turn and they are programmed in a direction extending from a lower end of even and odd bit lines BLe and BLo to an upper end of even and odd bit lines BLe and BLo. In addition, the LSB of each memory cell in corresponding even and odd pages can also be programmed when the memory cells connected to respective even and odd bit lines BLe and BLo are programmed so that a whole block of memory cells are programmed when the even and odd strings shown in FIGS. 23 and 24 are programmed.

When the LSBs of all the memory cells in the NAND flash memory device are programmed in the order shown in FIG. 23A, floating gate coupling tends to cause the threshold voltage distribution of each memory cell to broaden when adjacent memory cells are programmed. However, this broadening can be compensated for when the MSBs of the memory cells are programmed, as illustrated in FIG. 24.

Although the LSB programming order shown in FIG. 23A is elegant and orderly from a, design and implementation perspective, the order can be rearranged while still providing the benefit of being able to compensate for broadened threshold voltage distributions when performing MSB programming. Similarly, the order of the MSB programming can also be varied, as long as the LSB programming of all cells in the odd and even string is finished before the MSB programming is performed.

In FIG. 24A, the MSBs of the memory cells are programmed in the same order as the LSBs. In other words, the MSBs in the odd and even strings are programmed in turn and they are programmed from the lower end of even and odd bit lines BLe and BLo to the upper end of even and odd bit lines BLe and BLo. In addition, the MSB of each memory cell in corresponding even and odd pages can also be programmed when the memory cells connected to respective even and odd bit lines BLe and BLo are programmed so that a whole block of memory cells are programmed when the even and odd strings shown in FIGS. 23 and 24 are programmed.

Because MSB programming is performed after LSB programming for each memory cell in the even and odd strings shown in FIGS. 23 and 24, the MSB programming effectively compensates for the effects of floating gate coupling produced by LSB programming. As a result, the memory cells in the even and odd strings will tend to be negatively affected only by floating gate coupling effects caused by MSB programming.

Figure 22:
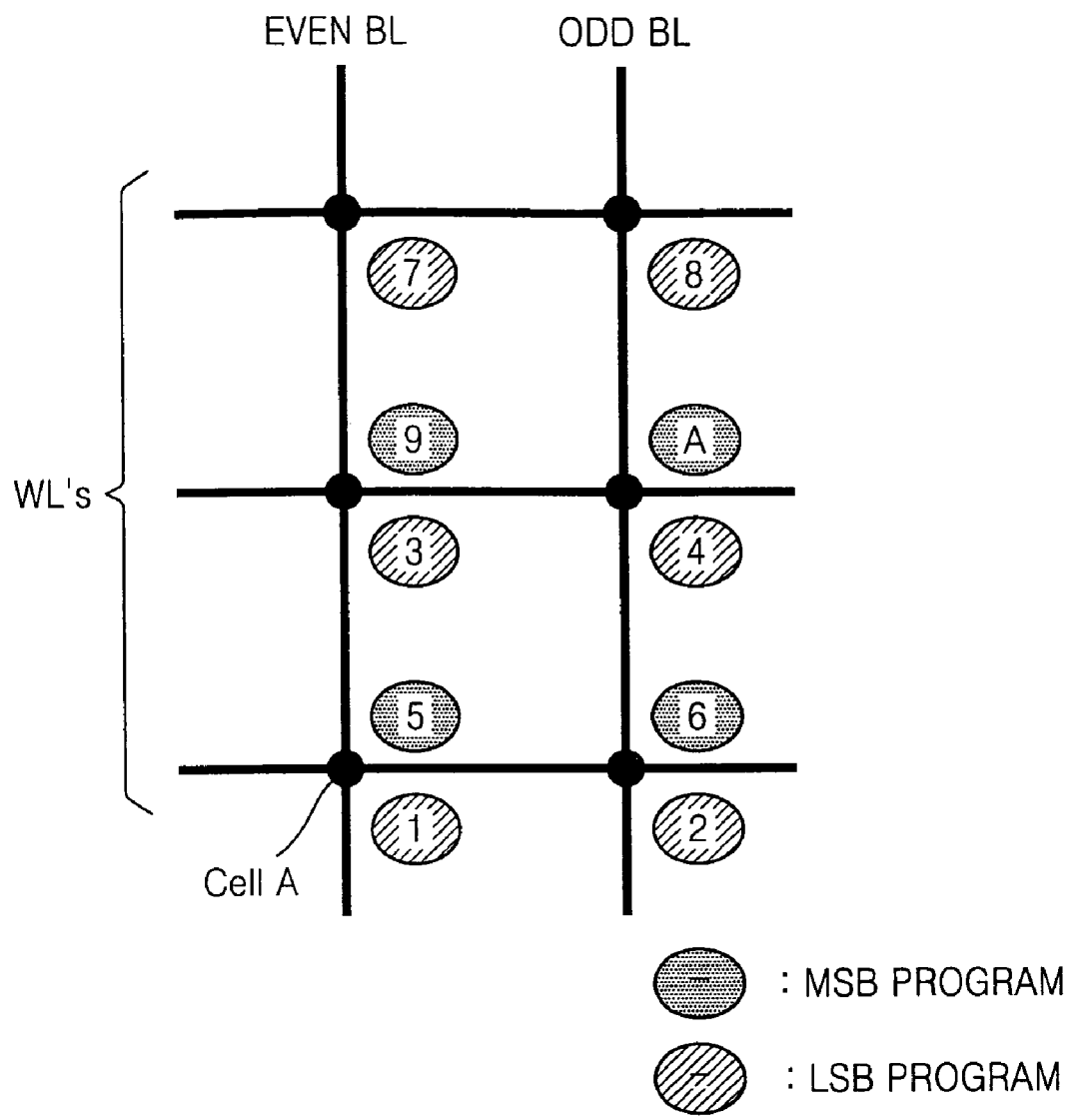
FIG. 22 is a conceptual diagram illustrating another conventional ordering for LSB and MSB program operations of a nonvolatile memory device.

Like the method illustrated in FIG.22, the programming method illustrated in FIGS. 23 and 24 programs the LSB of each memory cell and all adjacent memory cells before programming the memory cell's MSB. However, in contrast to the method of FIG. 22, the method of FIG. 23 programs the LSBs of all memory cells in the odd and even strings before programming the MSB of any of the memory cells. The requirement of programming the LSB of more than simply adjacent memory cells before programming a memory cell's MSB can eliminate some threshold voltage distribution broadening due to second-order floating gate coupling (i.e., floating gate coupling effects caused by memory cells not immediately adjacent to a memory cell). Further, the method illustrated in FIGS. 23 and 24 provides an elegant and orderly way of programming a large number of memory cells (e.g., a whole block), while minimizing harmful effects of floating gate coupling.

Figure 24B:
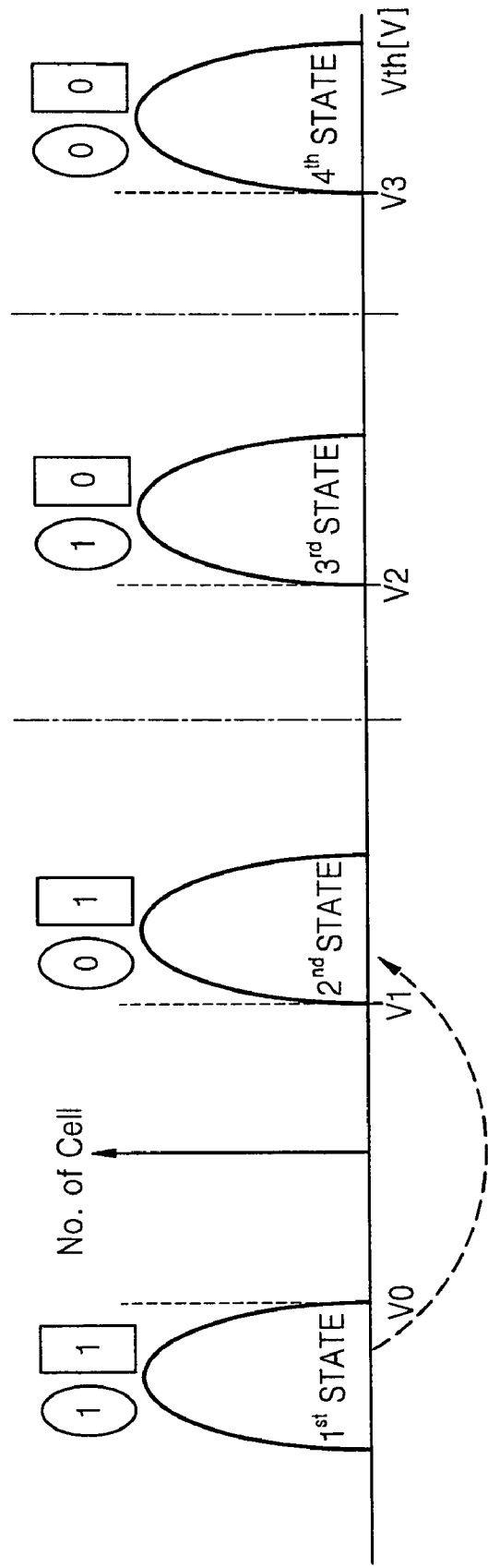

The compensation programming technique illustrated in FIG. 17B is also shown in FIG. 24B to illustrate how this technique can be used in combination with the programming order shown in FIGS. 23A and 24A. For example, if memory cells are programmed to either the first state or the intermediate state shown in FIG. 24B during LSB programming, then any MSB programming performed subsequently will have the following two features. First, as described above, the MSB programming of each memory cell will compensate for any broadening of the memory cell's-threshold voltage distribution during LSB programming of adjacent memory cells. Second, the MSB programming will change the threshold voltage distribution of the memory cell by at most two states, thereby minimizing the amount of threshold voltage broadening that occurs due to MSB programming of adjacent memory cells.

Figure 1A:
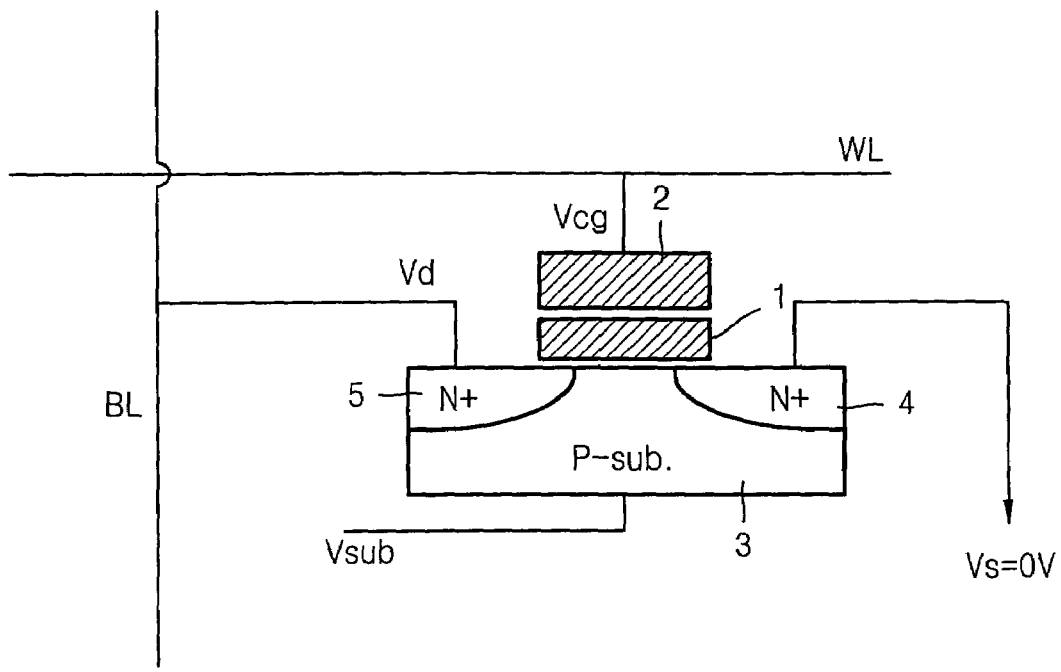
FIGS. 1A through 1C are a schematic view of a nonvolatile memory cell, a circuit symbol of a nonvolatile memory cell, and a threshold voltage characteristic of a nonvolatile memory cell, respectively.
Figure 1B:
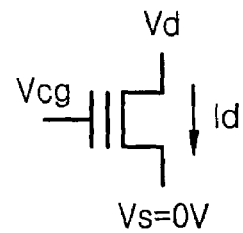
Figure 1C:
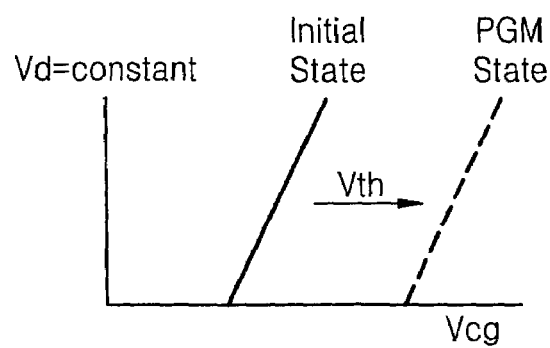
Figure 2:
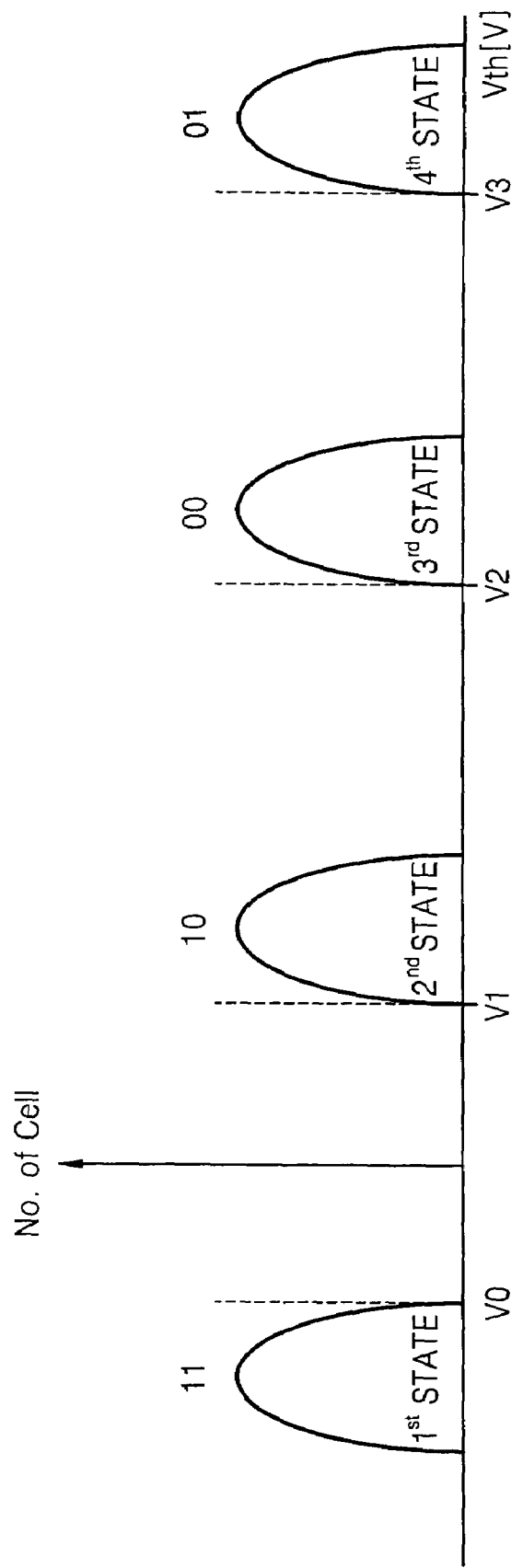
FIG. 2 is a graph illustrating threshold voltage distributions of a two-bit nonvolatile memory cell.
Figure 3A:
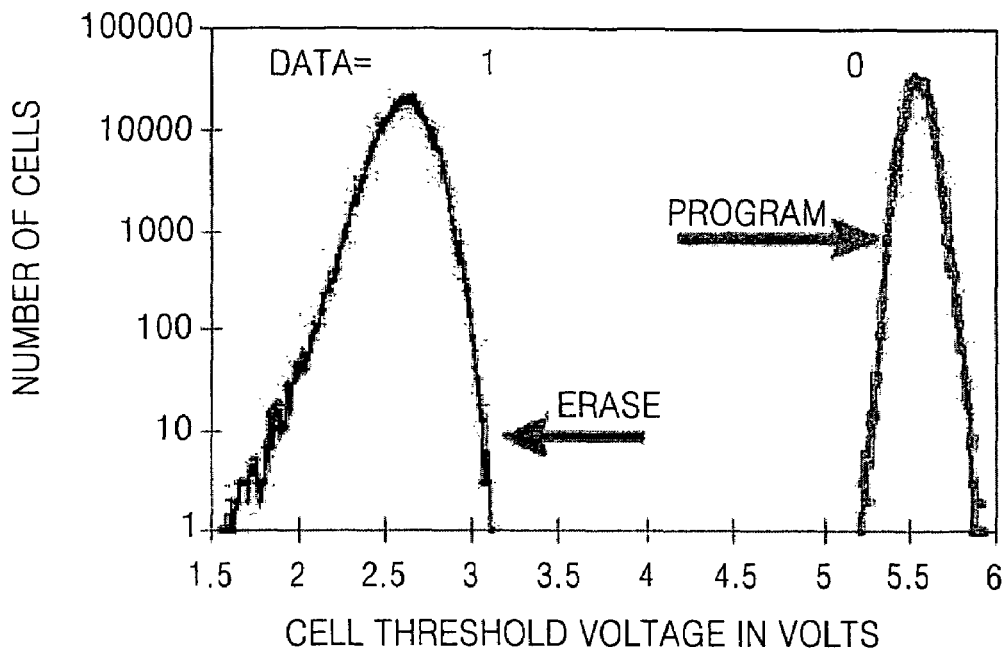
FIGS. 3A and 3B are graphs of empirical data showing the threshold voltage distributions of a one-bit nonvolatile memory cell and a two-bit nonvolatile memory cell, respectively.
Figure 3B:
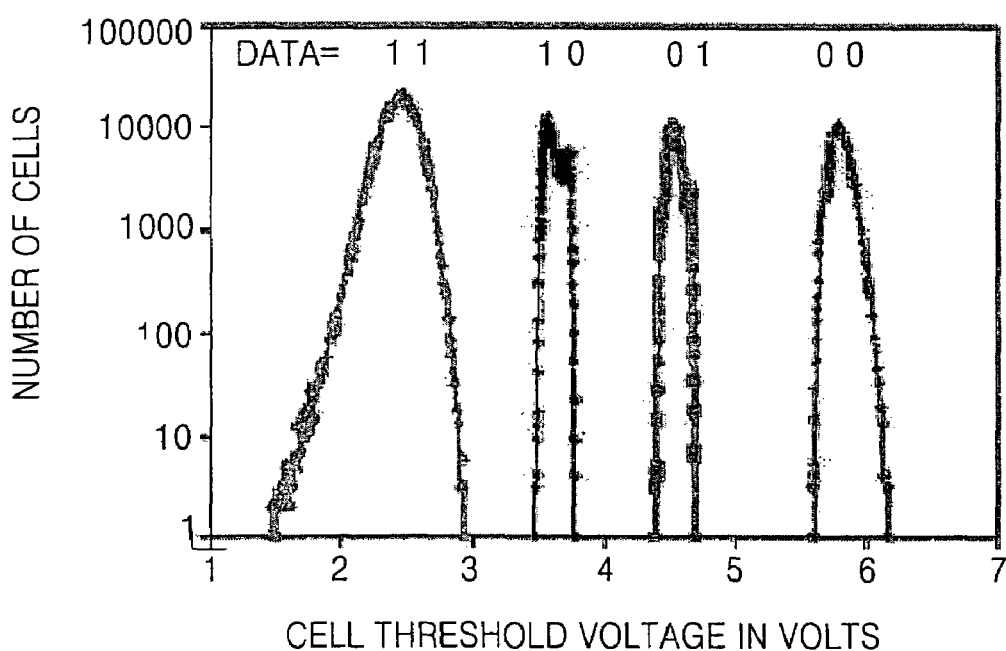
Figure 4A:
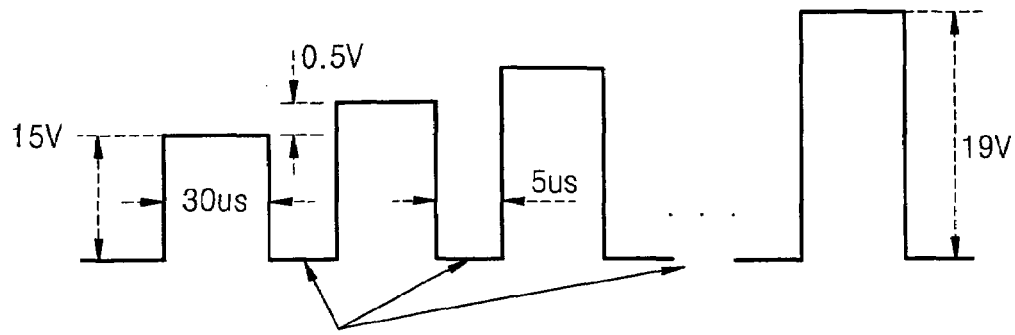
FIGS. 4A through 4C are a graph illustrating a pulse applied to a control gate of a nonvolatile memory cell during an incremental step pulse programming (ISPP) operation, a graph illustrating various threshold voltage distributions of the memory cell during the ISPP operation, and a flowchart illustrating the ISPP operation, respectively.
Figure 4B:
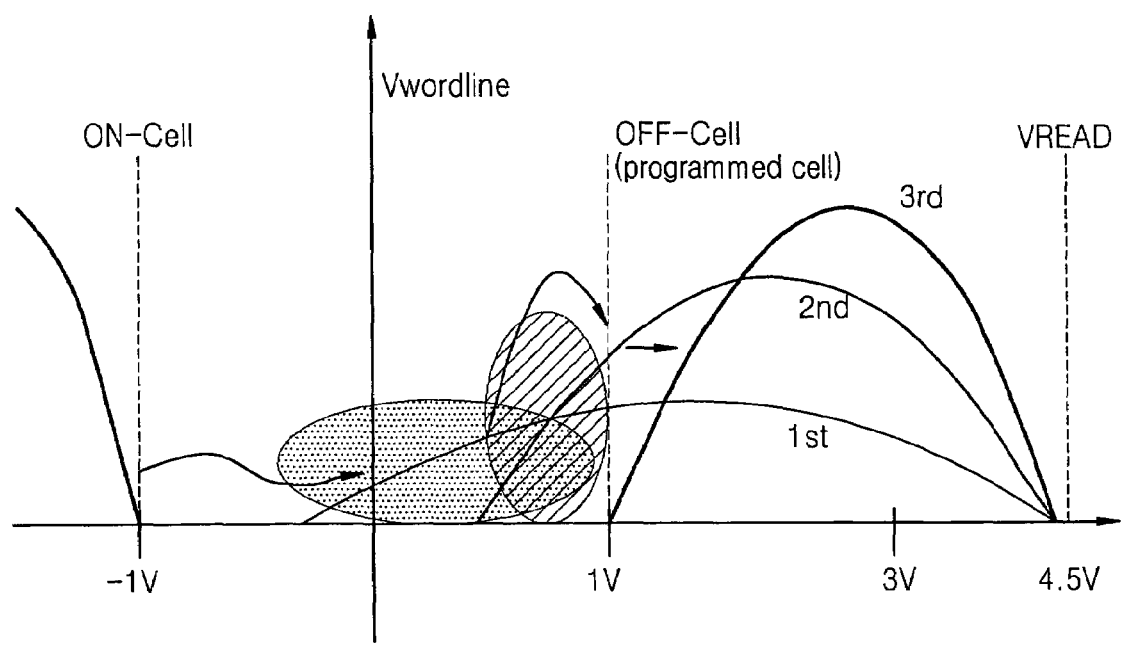
Figure 4C:
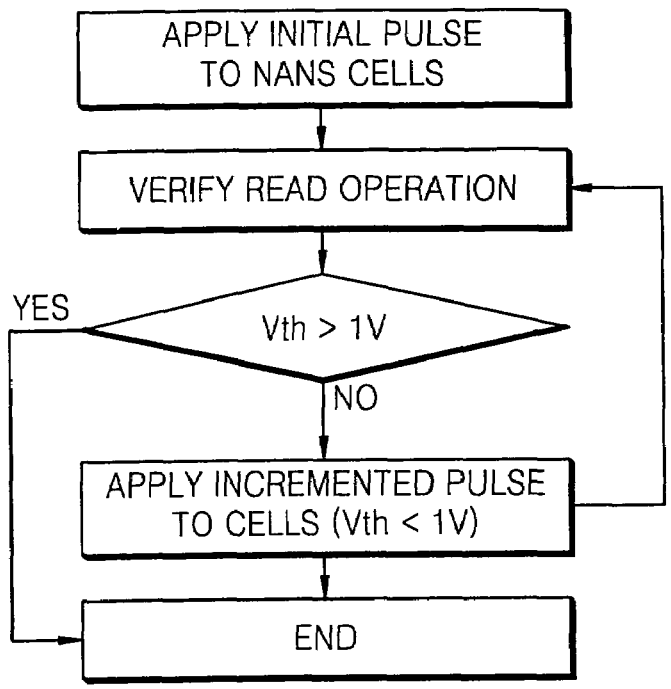
Figure 5:
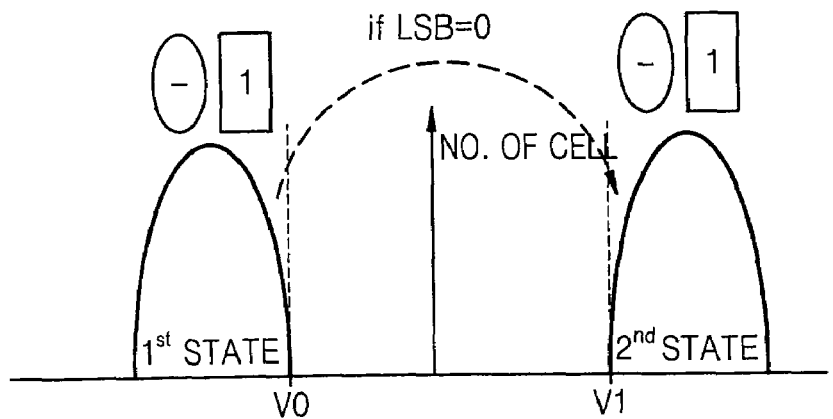
FIG. 5 is a graph illustrating a program operation for a least significant bit (LSB) of a two-bit nonvolatile memory cell.
Figure 6:
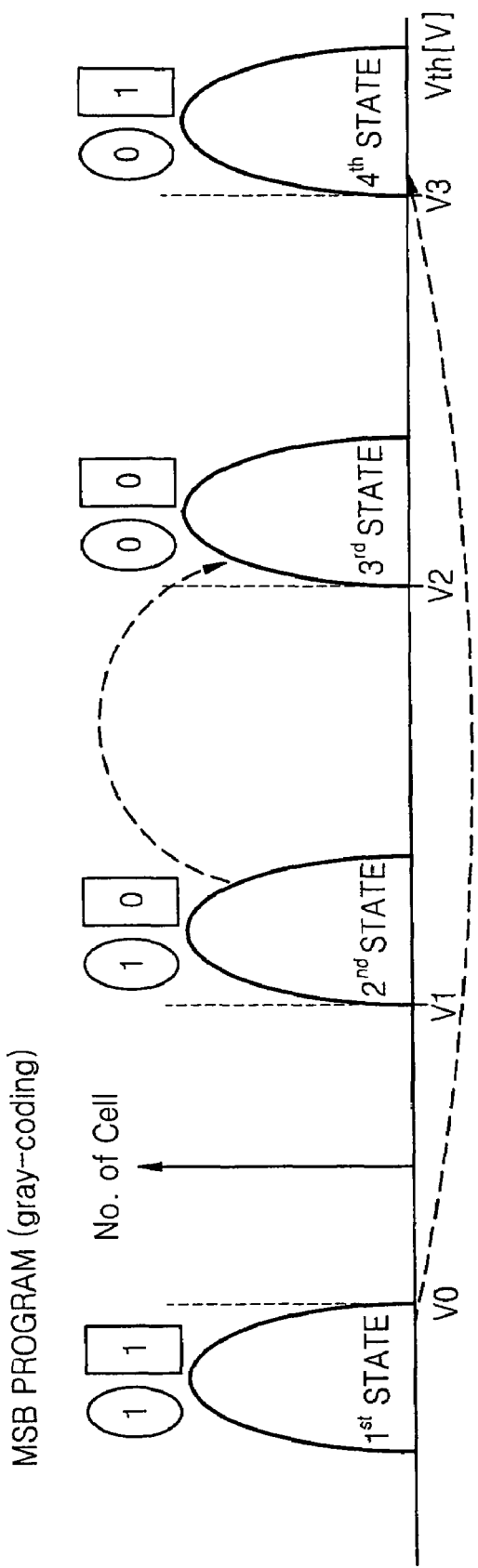
FIG. 6 is a graph illustrating a program operation for a most significant bit (MSB) of a two-bit nonvolatile memory cell using gray coded threshold voltage distributions.
Figure 7:
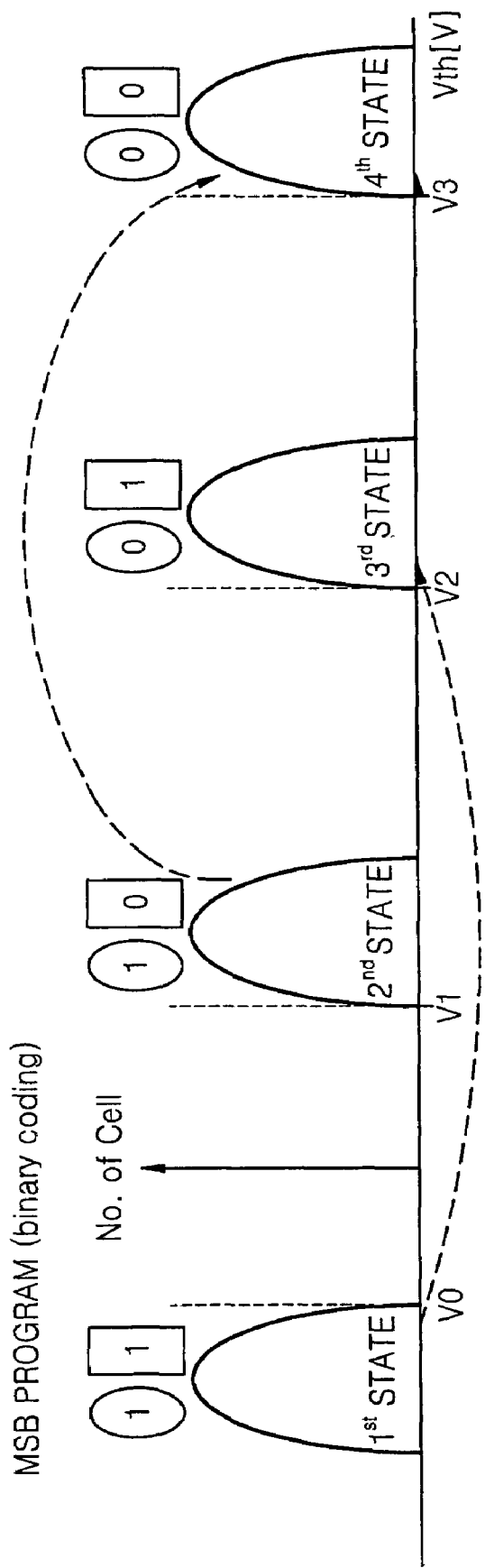
FIG. 7 is a graph illustrating a program operation for a MSB of a two-bit nonvolatile memory cell using binary coded threshold voltage distributions.
Figure 8:
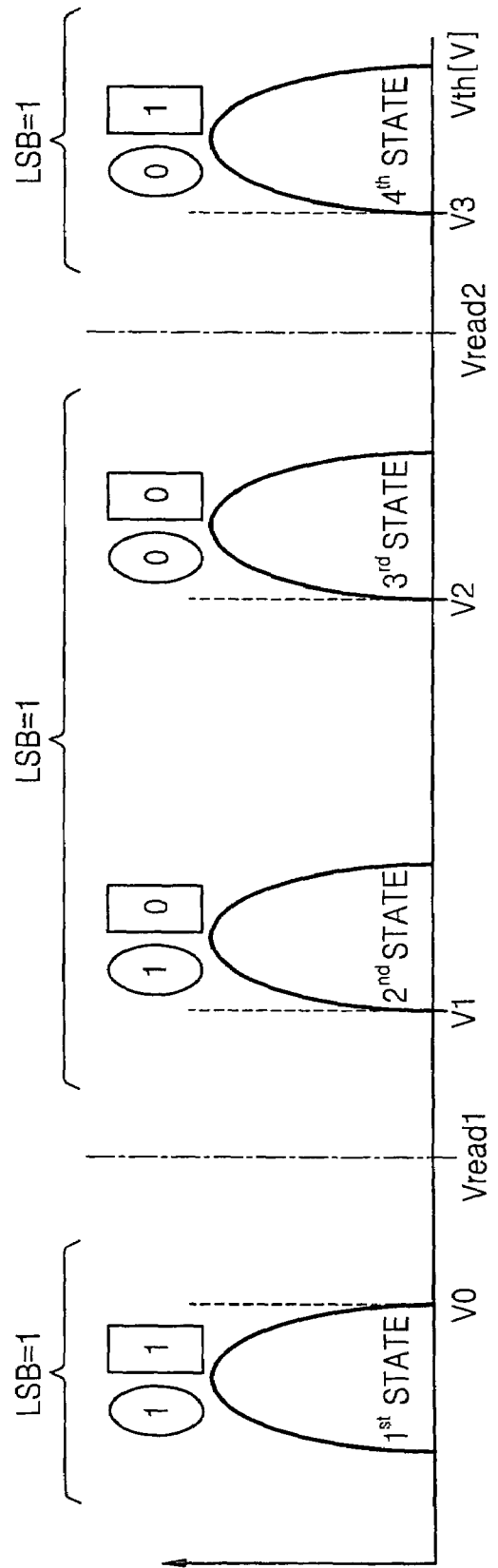
FIG. 8 is a graph illustrating a read operation for a LSB of a two-bit nonvolatile memory cell using gray coded threshold voltage distributions.
Figure 9:
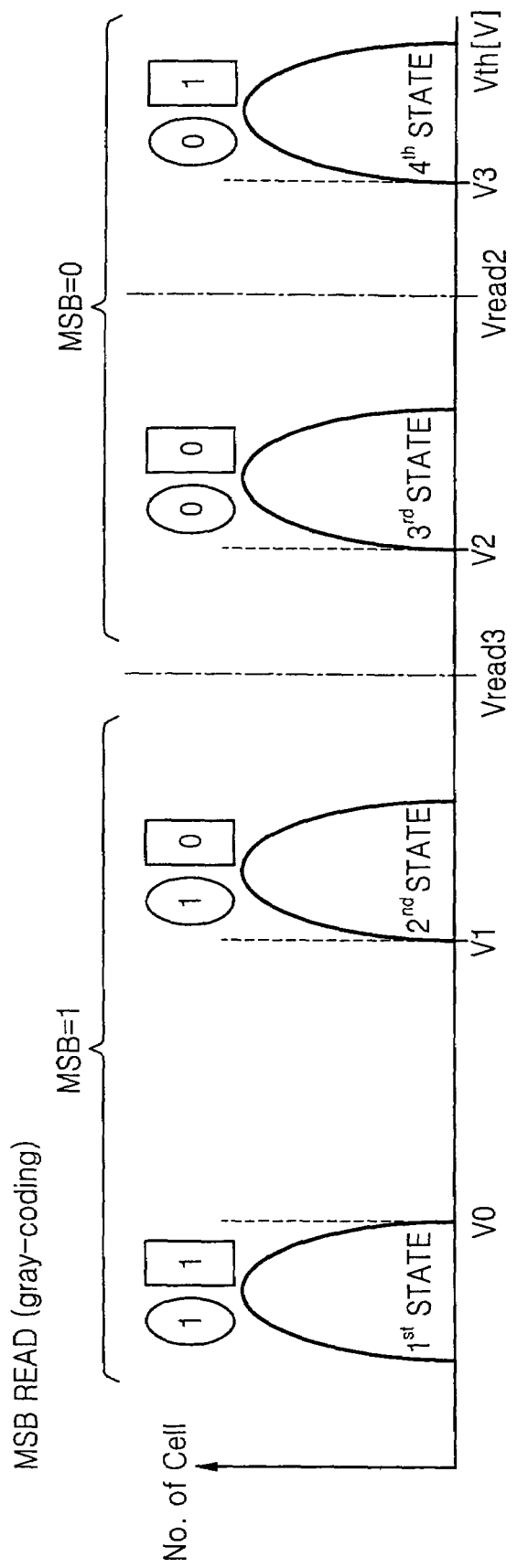
FIG. 9 is a graph illustrating a read operation for a MSB of a two-bit nonvolatile memory cell using gray coded threshold voltage distributions.

The method illustrated in FIG. 24 can be contrasted with conventional MSB programming such as that illustrated in FIG. 6, where a memory cell's threshold voltage changes by three states. Benefits of the technique shown in FIG. 24B can also be attained with gray-coded states by interchanging the two-bit logic values of the third and fourth states shown therein.

Figure 20A:
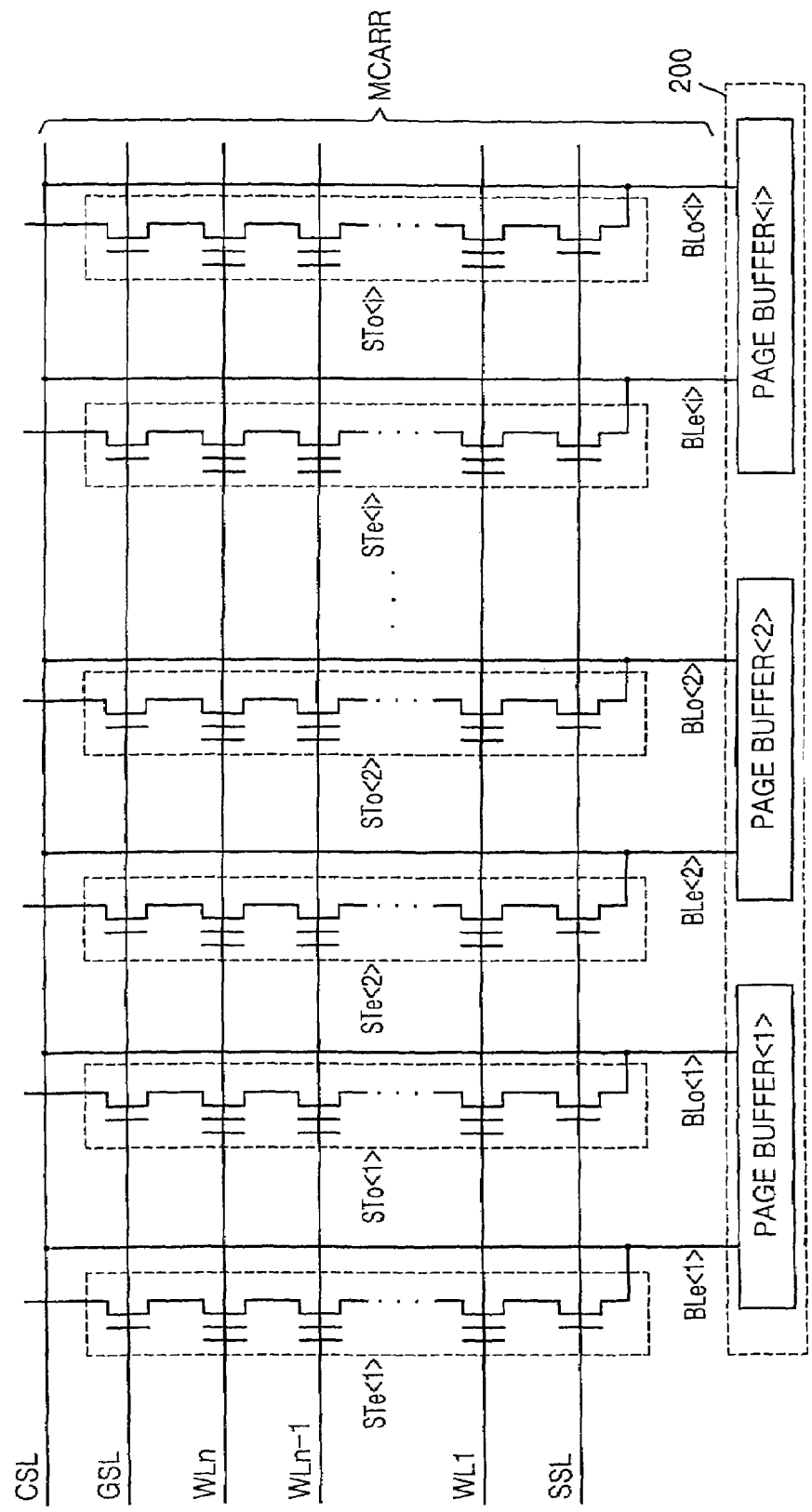
FIG. 20 is a circuit diagram of a nonvolatile memory device adapted to perform the program and read operations illustrated in FIGS. 17 through 19.
Figure 20B:
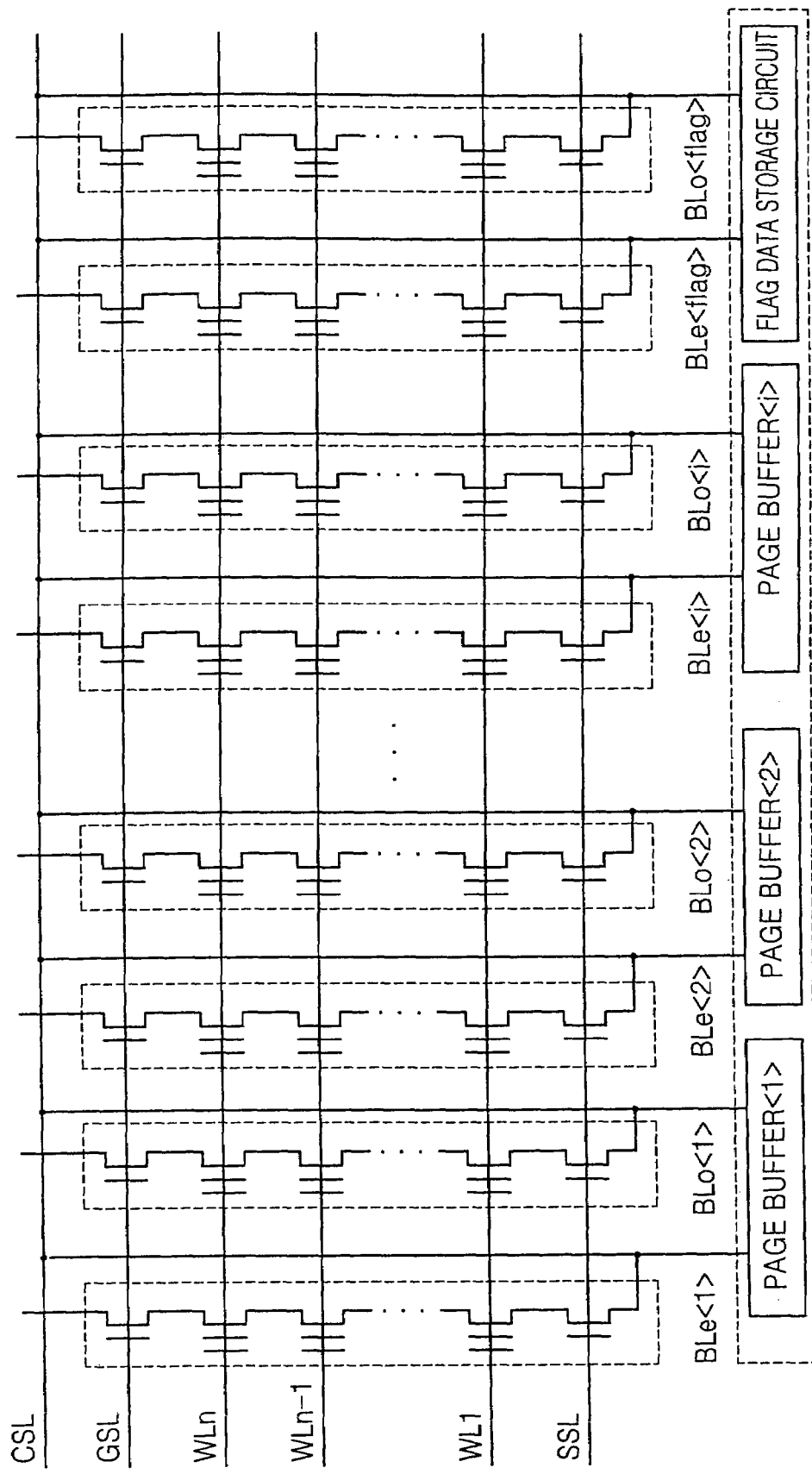
Figure 21:
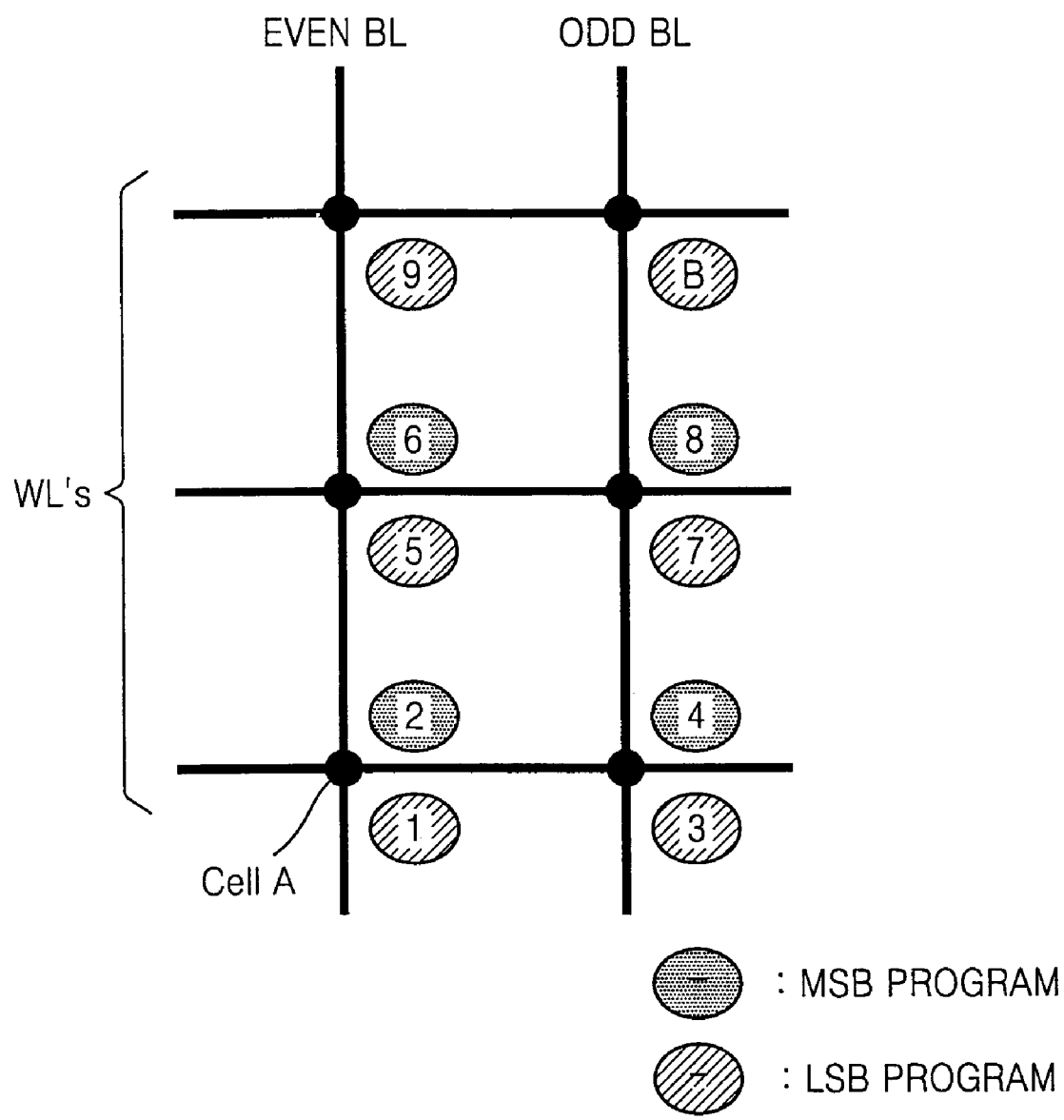
FIG. 21 is a conceptual diagram illustrating a conventional ordering for LSB and MSB program operations of a nonvolatile memory device.

When implementing the technique shown in FIG. 24B, a flag data storage circuit such as that illustrated in FIG. 20 is typically included in a page buffer circuit of the nonvolatile memory device to store the value of the flag cell when performing read operations. In addition, additional control logic is generally included in an interface and control unit of the nonvolatile memory device for performing the read operations.

Figure 25:
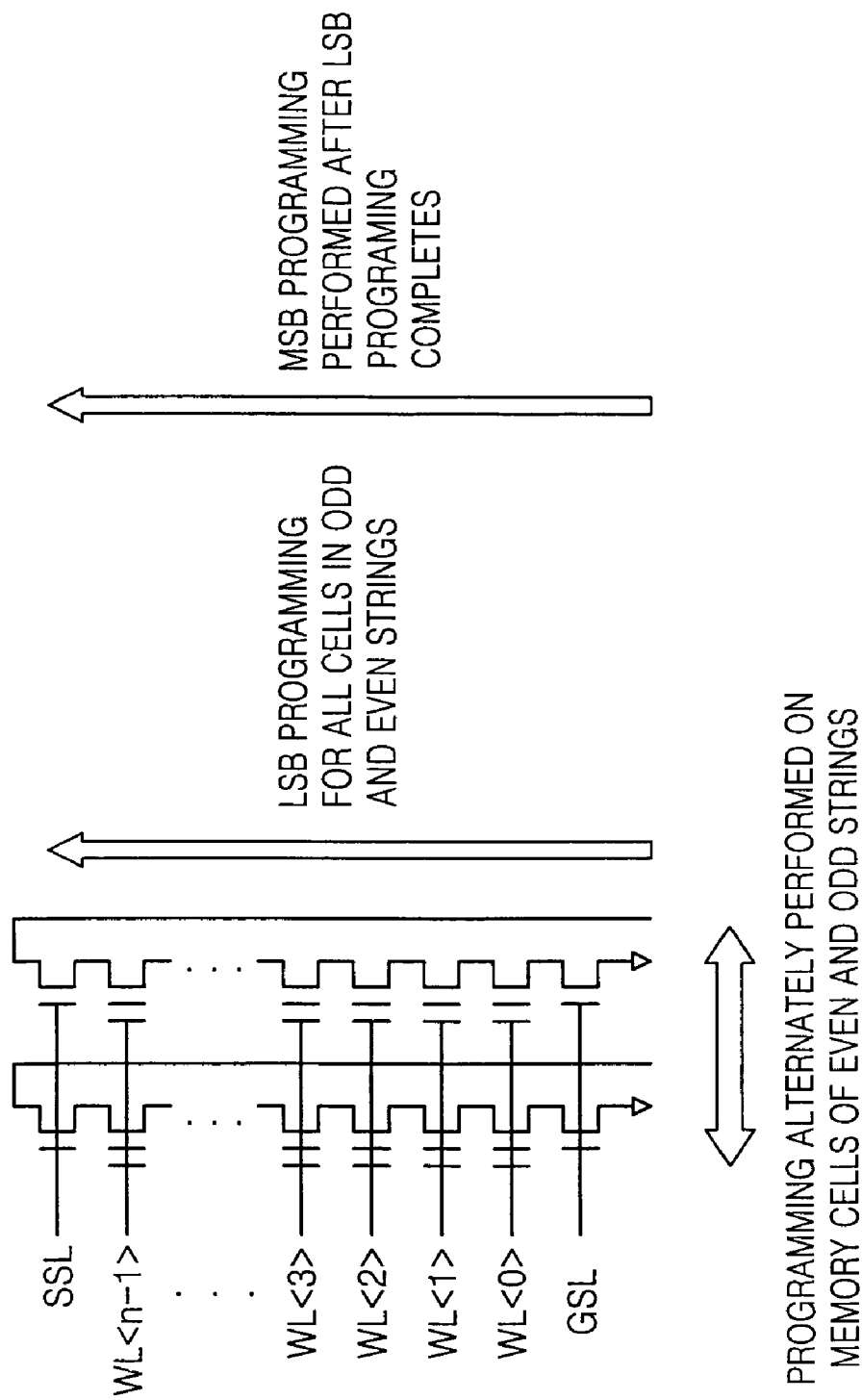
FIG. 25 is a conceptual diagram illustrating an ordering for LSB and MSB program operations according to still another embodiment of the invention.
Figure 26:
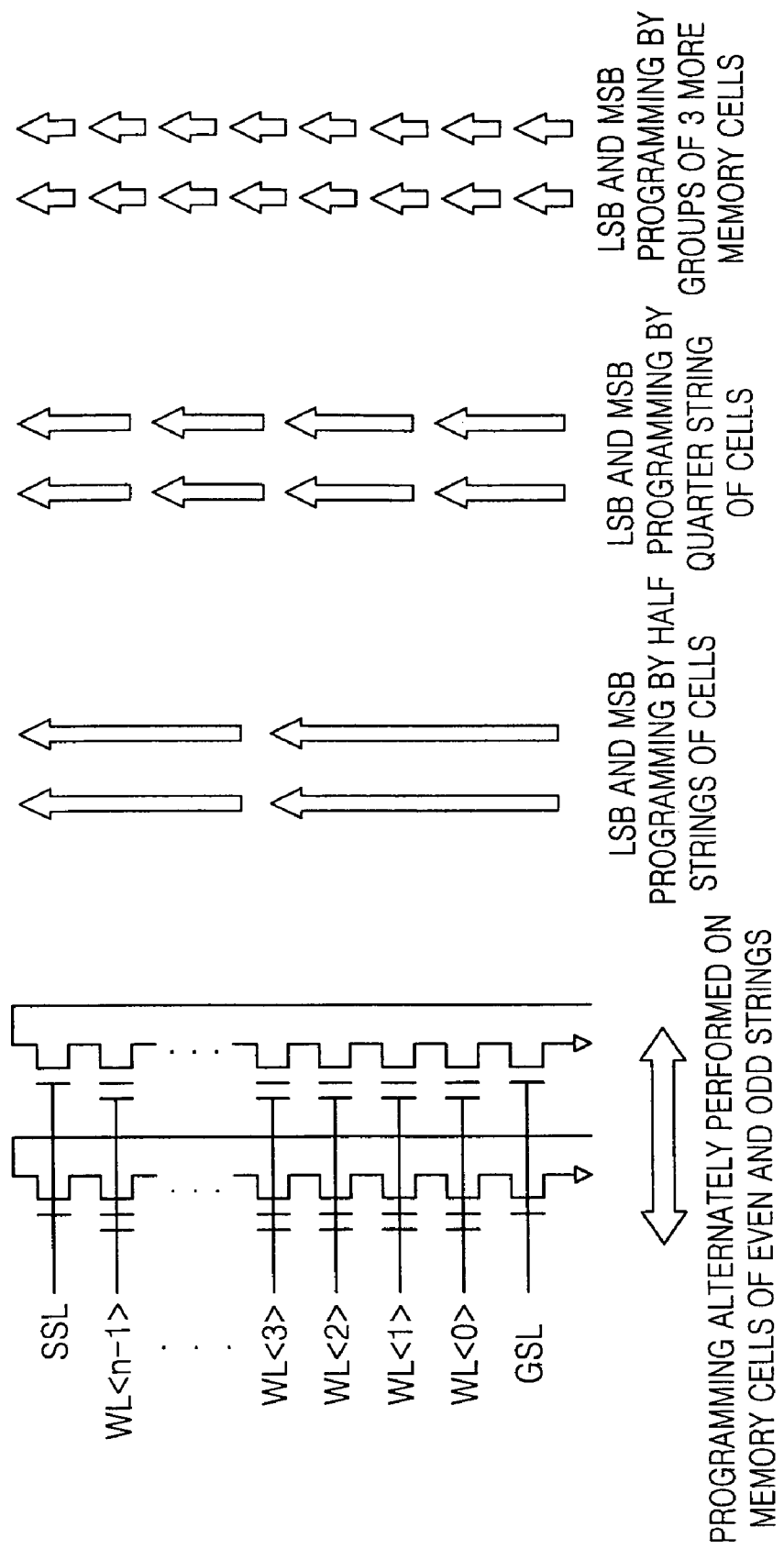
FIG. 26 is a conceptual diagram illustrating an ordering for LSB and MSB program operations according to still another embodiment of the invention; and, FIG. 27 is a conceptual diagram illustrating an ordering for LSB and MSB program operations according to yet another embodiment of the invention.

FIGS. 25 through 27 are conceptual diagrams illustrating several variations of the programming method illustrated in FIGS. 23 and 24. In FIGS. 25 through 27, arrows are used to illustrate the order in which memory cells are programmed during LSB and MSB programming.

FIG. 25 illustrates a generalized form of the programming method illustrated in FIGS. 23 and 24. Like the method illustrated in FIGS. 23 and 24, the method of FIG. 25 performs LSB programming on a pair of even and odd strings of memory cells before performing MSB programming on any memory cells in the strings. FIG. 25 omits an exact programming order to demonstrate that the programming order within the LSB and MSB programming can vary. However, as suggested by the arrows in FIG. 25, the LSB and MSB programming preferably proceed from one end of the strings to the other, and the programming is preferably performed in turn between the odd and even strings.

FIG. 26 shows several variations of the programming method illustrated in FIG. 25. As shown by the arrows in FIG. 26, LSB and MSB programming of the memory cells in the NAND flash memory device can be performed in units of a half of a string, a quarter of a string, or in groups of three or more contiguous memory cells. For example, in one method where each string shown in FIG. 26 comprises 32 memory cells, LSB programming is performed on a bottom group of 16 memory cells in each of an odd string and an even string. After performing LSB programming on the bottom 16 memory cells in the even and odd strings, MSB programming is performed on the same 16 memory cells in each of the even and odd strings. After LSB and MSB programming have been performed on the bottom 16 memory cells, LSB and MSB programming are similarly performed on a top 16 memory cells of the even and odd strings. Preferably, programming operations are alternately performed on the odd and even bit lines during the LSB and MSB programming.

FIG. 27 shows another variation of the programming method illustrated in FIG. 25. In the method illustrated in FIG. 27, LSB programming is performed on all memory cells in a pair of strings. Next, MSB programming is performed on the memory cells, and finally, compensation programming is performed on each of the memory cells in the pair of strings.

The method of FIG. 27 can be varied so that the compensation programming is additionally or alternatively performed between the LSB programming and the MSB programming. The method can also be varied so that the compensation programming is accomplished through the MSB programming, as illustrated, for example, by FIG. 24B. The method of FIG. 27 could be further altered by performing the LSB and MSB programming operations on groups of memory cells less than entire strings such as the groups illustrated in FIG. 26.

The foregoing exemplary embodiments are teaching examples. Accordingly, those of ordinary skill in the art will understand that various changes in form and details may be made to the embodiments without departing from the scope of the present invention as defined by the following claims.

What is claimed:

1. A method of programming a nonvolatile memory device comprising a plurality of n-valued nonvolatile memory cells arranged in a matrix, wherein n is a natural number greater than or equal to two (2), the method comprising:
   programming i-valued data to three or more memory cells contiguously arranged along a first direction of the matrix before programming (i+1)-valued data to any of the three or more memory cells, wherein i is less than n, and wherein the three or more memory cells are programmed during three or more respectively distinct program periods; and,
   after programming the i-valued data to the three or more memory cells, programming (i+1)-valued data to a particular memory cell among the three or more memory cells.

2. The method of claim 1, wherein the three or more memory cells comprise a string of memory cells in the nonvolatile memory device.

3. The method of claim 1, wherein the three or more memory cells comprise a half string or a quarter string of memory cells in the nonvolatile memory device.

4. The method of claim 1, further comprising:
   performing compensation programming on the particular memory cell to compensate for floating gate coupling between a floating gate of the particular memory cell and at least one floating gate of one or more memory cells adjacent to the particular memory cell in the matrix.

5. The method of claim 4, wherein the compensation programming is performed before the (i+1)-valued data is programmed to the particular memory cell.

6. The method of claim 4, wherein the compensation programming is performed before and after the (i+1)-valued data is programmed to the particular memory cell.

7. The method of claim 4, further comprising:
before performing the compensation programming, programming i+1 valued data to the one or more memory cells adjacent to the particular memory cell.

8. The method of claim 4, wherein programming the i-valued data to the three or more memory cells comprises:
adjusting a threshold voltage of the particular memory cell to a first value representing a first logic state in relation to a first state of a flag cell; and,
wherein performing the compensation programming on the particular memory cell comprises:
programming the (i+1)-valued data to the particular memory cell by adjusting the threshold voltage of the particular memory cell to a second value greater than the first value and representing the first logic state in relation to a second state of the flag cell.

9. The method of claim 1, further comprising:
programming i-valued data to all memory cells of a memory block containing the three or more memory cells before programming (i+1)-valued data to any memory cells within the memory block.

10. The method of claim 1, wherein when each memory cell among the three or more memory cells is programmed with i-valued or (i+1)-valued data, a corresponding memory page containing the memory cell being programmed is simultaneously programmed with i-valued or (i+1)-valued data.

11. The method of claim 1, further comprising:
defining respective first through fourth logic states "11," "01," "10," and "00" of the particular memory cell in relation to respective increasing first through fourth program verify levels;
wherein programming the i-valued data to the three or more memory cells comprises:
programming a '0' to an i-th bit of the particular memory cell by adjusting a threshold voltage of the particular memory cell to a first value between the second and third program verify levels and representing the second logic state in relation to a first state of a flag cell; and,
wherein programming the i+1 valued data to the particular memory cell comprises:
programming a '1' to an (i+1)-th bit of the particular memory cell by adjusting the threshold voltage of the particular memory cell to a second value between the third and fourth program verify levels and representing the second logic state in relation to a second state of the flag cell; or,
programming a '0' to the (i+1)-th bit of the particular memory cell by adjusting the threshold voltage of the particular memory cell to a third value greater than the fourth program verify level and representing the fourth logic state.

12. The method of claim 1, wherein the nonvolatile memory device comprises a NAND-type flash memory device.

13. The method of claim 1, wherein n is equal to two (2), and the i-valued data is a least significant bit of data, and the (i+1)-valued data is a most significant bit of data.

14. A method of programming a nonvolatile memory device comprising a plurality of n-valued nonvolatile memory cells arranged in a matrix and further arranged in a plurality of strings, wherein n is a natural number greater than or equal to two (2), the method comprising:
defining odd and even strings among the plurality of strings and identifying a particular odd string and a corresponding particular even string among the odd and even strings;
programming i-valued data to first and second groups of three or more contiguous memory cells within the particular odd and even strings, respectively, before programming (i+1)-valued data to any memory cells in the first odd and even strings;
after programming i-valued data to the first and second groups of three or more contiguous memory cells, programming (i+1)-valued data to a particular memory cell among the first and second groups of three or more contiguous memory cells.

15. The method of claim 14, further comprising:
programming (i+1)-valued data to additional memory cells in the first and second groups in an order that alternates between the particular odd and even strings and proceeds along a first direction of the matrix in each of the particular odd and even strings.

16. The method of claim 15, wherein the first and second groups of contiguous memory cells comprise all of the memory cells within the particular odd and even strings, respectively.

17. The method of claim 15, wherein the first and second groups of contiguous memory cells each comprise a half or a quarter of the memory cells within the particular odd and even strings, respectively.

18. The method of claim 15, further comprising:
performing compensation programming on the particular memory cell to compensate for floating gate coupling between a floating gate of the particular memory cell and floating gates of one or more memory cells adjacent to the particular memory cell.

19. The method of claim 18, wherein the compensation programming is performed before the (i+1)-valued data is programmed to the particular memory cell.

20. The method of claim 18, wherein the compensation programming is performed before and after the (i+1)-valued data is programmed to the particular memory cell.

21. The method of claim 18, wherein the (i+1)-valued data is programmed to the additional memory cells in the first and second groups before the compensation programming is performed.

22. The method of claim 18, wherein programming the i-valued data to the first and second groups of three or more contiguous memory cells comprises:
adjusting a threshold voltage of the particular memory cell to a first value representing a first logic state in relation to a first state of a flag cell; and,
wherein performing the compensation programming on the particular memory cell comprises:
programming the (i+1)-valued data to the particular memory cell by adjusting the threshold voltage of the particular memory cell to a second value greater than the first value and representing the first logic state in relation to a second state of the flag cell.

23. The method of claim 14, wherein when any memory cell in the first group of contiguous memory cells is programmed with i-value data or (i+1)-valued data, a corresponding odd memory page containing the memory cell being programmed is simultaneously programmed with i-valued or (i+1)-valued data; and,
when any memory cell in the second group of contiguous memory cells is programmed with i-value data or (i+1)-valued data, a corresponding even memory page containing the memory cell being programmed is simultaneously programmed with i-valued or (i+1)-valued data.

24. A nonvolatile memory device, comprising:
a memory array including a plurality of n-valued memory cells arranged in a matrix, where n is a natural number greater than or equal to two (2);
wherein a group of three or more memory cells contiguously arranged along a first direction in the matrix are programmed with i-valued data (i<n) during three or more respectively distinct program periods, before any of the three or more memory cells is programmed with (i+1)-valued data, and then after all of the three or more memory cells are programmed with the i-valued data, a particular memory cell among the three or more memory cells is programmed with (i+1)-valued data.

25. The device of claim 24, wherein the memory cells are further arranged in a plurality of strings;
wherein all memory cells within each string are programmed with i-valued data before any memory cell in the string is programmed with (i+1)-valued data; and,
wherein after all memory cells within the string are programmed with the i-valued data, one or more memory cells in the string are programmed with (i+1)-valued data.

26. The device of claim 24, wherein the memory cells are further arranged in a plurality of strings;
wherein all memory cells within each half or quarter string are programmed with i-valued data before any memory cell in the half or quarter string is programmed with (i+1)-valued data; and,
wherein after all memory cells within the half or quarter string are programmed with the i-valued data, one or more memory cells in the half or quarter string are programmed with (i+1)-valued data.

27. The device of claim 25, wherein the plurality of strings forms a memory block;
wherein all memory cells within the memory block are programmed with i-valued data before any memory cell in the memory block is programmed with (i+1)-valued data; and,
wherein after all memory cells within the memory block are programmed with i-valued data, one or memory cells in the memory block are programmed with (i+1)-valued data.

28. The device of claim 24, wherein the plurality of strings comprise odd and even strings; and,
wherein memory cells within the odd and even strings are programmed with (i+1)-valued data in an order that alternates between an odd string and an even string and proceeds along the first direction of the matrix.

29. The device of claim 24, further comprising a flag cell;
wherein the i-valued data is programmed to the three or more memory cells by adjusting a threshold voltage of the particular memory cell to a first value representing a first logic state in relation to a first state of the flag cell; and,
wherein the (i+1)-valued data is programmed to the particular memory cell by adjusting the threshold voltage of the particular memory cell to a second value greater than the first value and representing the first logic state in relation to a second state of the flag cell.

30. The device of claim 24, wherein compensation programming is performed on the particular memory cell to compensate for floating gate coupling between a floating gate of the particular memory cell and floating gates of one or more memory cells adjacent to the particular memory cell in the matrix.

31. The device of claim 30, wherein the compensation programming is performed before the (i+1)-valued data is programmed to the particular memory cell.

32. The device of claim 30, wherein the compensation programming is performed before and after the (i+1)-valued data is programmed to the particular memory cell.

33. The device of claim 24, wherein when each memory cell among the three or more memory cells is programmed with i-valued or (i+1)-valued data, a corresponding memory page containing the memory cell being programmed is simultaneously programmed with i-valued or (i+1)-valued data.

34. The device of claim 24, further comprising:
an interface and control unit adapted to control program operations of the n-valued memory cells in relation to received commands and addresses;
a row decoder adapted to select rows containing the three or more memory cells in relation to respective row addresses output by the interface and control unit;
a column decoder adapted to select columns of the three or more memory cells in relation to respective column addresses output by the interface and control unit;
a page buffer adapted to store a page of data to be read from or written to the memory array in relation to a page buffer command from the interface and control unit and a page buffer column address output by the column decoder; and,
an input/output (I/O) unit adapted to communicate data to be written to and read from the memory array between the page buffer and a host in relation to an (I/O) command from the interface and control unit and an (I/O) column address output by the column decoder.

* * * * *